US009281327B2

(12) United States Patent
Tanikuni et al.

(10) Patent No.: US 9,281,327 B2
(45) Date of Patent: Mar. 8, 2016

(54) IMAGE SENSOR, IMAGING APPARATUS, AND APPARATUS AND METHOD FOR MANUFACTURING IMAGE SENSOR

(71) Applicant: Sony Corporation, Tokyo (JP)

(72) Inventors: Takamasa Tanikuni, Kumamoto (JP); Shinpei Yamaguchi, Tokyo (JP); Shuji Manda, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 120 days.

(21) Appl. No.: 13/959,106

(22) Filed: Aug. 5, 2013

(65) Prior Publication Data

US 2014/0043497 A1 Feb. 13, 2014

(30) Foreign Application Priority Data

Aug. 8, 2012 (JP) .................................. 2012-175540
May 24, 2013 (JP) .................................. 2013-109611

(51) Int. Cl.
*H04N 3/14* (2006.01)
*H01L 27/146* (2006.01)

(52) U.S. Cl.
CPC .......... *H01L 27/146* (2013.01); *H01L 27/1462* (2013.01); *H01L 27/1464* (2013.01); *H01L 27/14685* (2013.01); *H01L 27/14627* (2013.01)

(58) Field of Classification Search
None
See application file for complete search history.

(56) References Cited

U.S. PATENT DOCUMENTS

| | | | | |
|---|---|---|---|---|
| 2005/0287479 A1* | 12/2005 | Moon | ................. | G03F 7/091 430/330 |
| 2006/0244088 A1* | 11/2006 | Inagaki | ............. | H01L 27/14603 257/451 |
| 2008/0142856 A1* | 6/2008 | Sato | ................. | H01L 27/14609 257/292 |
| 2009/0256225 A1* | 10/2009 | Nakai | ............... | H01L 27/14623 257/432 |
| 2010/0201834 A1* | 8/2010 | Maruyama et al. | ........ | 348/222.1 |
| 2011/0241148 A1* | 10/2011 | Hiyama et al. | ................ | 257/435 |
| 2012/0008024 A1* | 1/2012 | Takimoto | ..................... | 348/294 |

FOREIGN PATENT DOCUMENTS

JP  2006-196587        7/2006
JP  2006196587 A  *  7/2006

OTHER PUBLICATIONS

Smolinsky, N., et al., "Hot-Carrier Aging of the MOS Transistor in the Presence of Spin on Glass as the Interlevel Dielectric", IEEE Electron Device Letters, vol. 12, No. 3, dated Mar. 1991.

* cited by examiner

*Primary Examiner* — Twyler Haskins
*Assistant Examiner* — Wesley J Chiu
(74) *Attorney, Agent, or Firm* — Hazuki International, LLC

(57) ABSTRACT

There is provided an apparatus including an image sensor of a back-illuminated type using a complementary metal oxide semiconductor (CMOS), including a light receiving unit, formed in a semiconductor substrate, which receives incident light, an anti-reflection film formed on a back-surface side of the semiconductor substrate in which the light receiving unit is formed, and a silicon oxide film, formed on a back-surface side of the anti-reflection film, which has a refractive index lower than a silicon nitride film and has a higher density in a back-surface side than in a front-surface side thereof.

13 Claims, 23 Drawing Sheets

US 9,281,327 B2

IMAGE SENSOR, IMAGING APPARATUS, AND APPARATUS AND METHOD FOR MANUFACTURING IMAGE SENSOR

BACKGROUND

The present technology generally relates to an image sensor, an imaging apparatus, and an apparatus and method for manufacturing the image sensor. More particularly, the present technology relates to an image sensor, an imaging apparatus, and an apparatus and method for manufacturing the image sensor, capable of suppressing deterioration in an interface state of an interface in a silicon substrate.

Recently, in a back-illuminated complementary metal oxide semiconductor (CMOS) image sensor, a silicon (Si) substrate is coated with a silicon (Si) oxide film with a good interface state. However, as pixels are made to be fine, it has become difficult to ignore deterioration in the interface state due to moisture (for example, see "Hot-Carrier Aging of the MOS Transistor in the Presence of Spin-on Glass as the Interlevel Dielectric", IEEE ELECTRON DEVICE LETTERS, VOL. 12, NO. 3, MARCH 1991).

Thus, a technique for forming a silicon (Si) nitride film as a film for preventing penetration of moisture has been proposed (see, Japanese Unexamined Patent Application Publication No. 2006-196587).

SUMMARY

However, in a case where a silicon oxide film on an anti-reflection film is used as a moisture barrier film or in a case where a silicon oxide film and a silicon nitride film are stacked on an anti-reflection film, there are disadvantages that the anti-reflection effect is lowered and the interface state is deteriorated due to nitrogen.

In view of the above, it is desirable to suppress deterioration in an interface state of an interface in a silicon substrate.

According to an embodiment of the present technology, there is provided an image sensor of a back-illuminated type using a complementary metal oxide semiconductor (CMOS), including a light receiving unit, formed in a semiconductor substrate, which receives incident light, an anti-reflection film formed on a back-surface side of the semiconductor substrate in which the light receiving unit is formed, and a silicon oxide film, formed on a back-surface side of the anti-reflection film, which has a refractive index lower than a silicon nitride film and has a higher density in a back-surface side than in a front-surface side thereof.

The anti-reflection film and the silicon oxide film may be formed in a recess at the back-surface side of the semiconductor substrate, the recess being excavated to embed a light shielding film.

The silicon oxide film may be made of a plurality of layers. A density of each of the layers may be increased toward a back-surface side thereof.

The silicon oxide film may include a layer of a silicon oxide film containing no nitrogen at the front-surface side and includes a layer of a silicon oxynitride film containing nitrogen at the back-surface side.

The image sensor may further include a light shielding film formed near a boundary with a neighboring pixel between the layer of the silicon oxide film containing no nitrogen and the layer of the silicon oxynitride film containing nitrogen.

The anti-reflection film and the layer of the silicon oxide film containing no nitrogen may be formed in a recess at the back-surface side of the semiconductor substrate, the recess being excavated to embed a light shielding film.

A refractive index of each layer of the silicon oxide film may be increased toward the back-surface side.

The silicon oxide film may be formed to have a density that is continuously increased toward the back-surface side from the front-surface side.

The silicon oxide film may not contain nitrogen at a surface and may be formed to have a content of nitrogen that is continuously increased toward the back-surface side from the front-surface side.

The silicon oxide film may be formed to have a refractive index that is continuously increased toward the back-surface side from the front-surface side.

The light receiving unit, the anti-reflection film, and the silicon oxide film may be formed in an OPB pixel.

According to another embodiment of the present technology, there is provided an imaging apparatus including an image sensor of a back-illuminated type using a complementary metal oxide semiconductor (CMOS), the image sensor including a light receiving unit, formed in a semiconductor substrate, which receives incident light, an anti-reflection film formed on a back-surface side of the semiconductor substrate in which the light receiving unit is formed, and a silicon oxide film, formed on a back-surface side of the anti-reflection film, which has a refractive index lower than a silicon nitride film and has a higher density in a back-surface side than in a front-surface side thereof, and an image processing unit for performing an image processing on image data obtained from the image sensor.

According to still another embodiment of the present technology, there is provided an apparatus for manufacturing a back-illuminated image sensor using a complementary metal oxide semiconductor (CMOS), including an anti-reflection film deposition section for depositing an anti-reflection film on a back-surface side of a semiconductor substrate in which a light receiving unit for receiving incident light is formed, and a silicon oxide film deposition section for depositing a silicon oxide film on the back-surface side of the semiconductor substrate on which the anti-reflection film is deposited by the anti-reflection film deposition section. The silicon oxide film has a refractive index lower than a silicon nitride film and has a higher density in a back-surface side than in a front-surface side thereof.

The anti-reflection film deposition section and the silicon oxide film deposition section may deposit the anti-reflection film and the silicon oxide film, respectively, in a recess at the back-surface side of the semiconductor substrate, the recess being excavated to embed a light shielding film.

The silicon oxide film deposition section may deposit a plurality of layers of the silicon oxide film so that a density of each of the layers is increased toward a back-surface side.

The silicon oxide film deposition section may includes a first silicon oxide film deposition section for depositing a layer of a silicon oxide film containing no nitrogen on a front-surface side thereof as the silicon oxide film, and a second silicon oxide film deposition section for depositing a layer of a silicon oxynitride film containing nitrogen on a back-surface side thereof as the silicon oxide film.

The apparatus may further include a light shielding film deposition section for depositing a light shielding film, and a light shielding film processing section for processing the light shielding film deposited by the light shielding film deposition section in a manner that a portion of the light shielding film near a boundary with a neighboring pixel is remained. The light shielding film deposition section may deposit the light shielding film on a back-surface side of the layer of the silicon oxide film containing no nitrogen which is deposited by the first silicon oxide film deposition section. The second silicon oxide film deposition section may deposit the layer of the silicon oxynitride film containing nitrogen on a back-surface side of the light shielding film which is processed by the light shielding film processing section.

The apparatus may further include a recess forming portion for excavating a recess to embed a light shielding film into the back-surface side of the semiconductor substrate. The anti-reflection film deposition section and the first silicon oxide film deposition section may deposit the anti-reflection film and the layer of the silicon oxide film containing no nitrogen, respectively, on the recess formed by the recess forming portion at the back-surface side of the semiconductor substrate.

The silicon oxide film deposition section may deposit the silicon oxide film in a manner that the silicon oxide film appropriately contains nitrogen to allow a density of the silicon oxide film to be controlled depending on a content of nitrogen.

According to still another embodiment of the present technology, there is provided a method for manufacturing an image sensor of a back-illuminated type using a complementary metal oxide semiconductor (CMOS) in a manufacturing apparatus. The method includes depositing an anti-reflection film on a back-surface side of a semiconductor substrate in which a light receiving unit for receiving incident light is formed; and depositing a silicon oxide film having a refractive index lower than a silicon nitride film and having a higher density in a back-surface side than in a front-surface side thereof on a back-surface side of the anti-reflection film deposited on the back-surface side of the semiconductor substrate.

According to an embodiment of the present technology, there is provided an image sensor of a back-illuminated type using a CMOS. The image sensor includes a light receiving unit, formed in a semiconductor substrate, which receives incident light; an anti-reflection film formed on a back-surface side of the semiconductor substrate in which the light receiving unit is formed, and a silicon oxide film, formed on a back-surface side of the anti-reflection film, which has a refractive index lower than a silicon nitride film and has a higher density in a back-surface side than in a front-surface side thereof.

According to another embodiment of the present technology, there is provided an imaging apparatus which includes an image sensor of a back-illuminated type using a CMOS and an image processing unit for performing an image processing on image data obtained from the image sensor. The image sensor includes a light receiving unit, formed in a semiconductor substrate, which receives incident light, an anti-reflection film formed on a back-surface side of the semiconductor substrate in which the light receiving unit is formed, and a silicon oxide film, formed on a back-surface side of the anti-reflection film, which has a refractive index lower than a silicon nitride film and has a higher density in a back-surface side than in a front-surface side thereof.

According to still another embodiment of the present technology, an anti-reflection film is deposited on a back-surface side of a semiconductor substrate in which a light receiving unit for receiving incident light is formed, and a silicon oxide film having a refractive index lower than a silicon nitride film and having a higher density in a back-surface side than in a front-surface side thereof is deposited on a back-surface side of the anti-reflection film deposited on the back-surface side of the semiconductor substrate.

According to the embodiments of the present technology, it is possible to process an image. In particular, it is possible to suppress deterioration in an interface state of an interface in the silicon substrate.

DETAILED DESCRIPTION OF THE EMBODIMENT(S)

Figure 1:
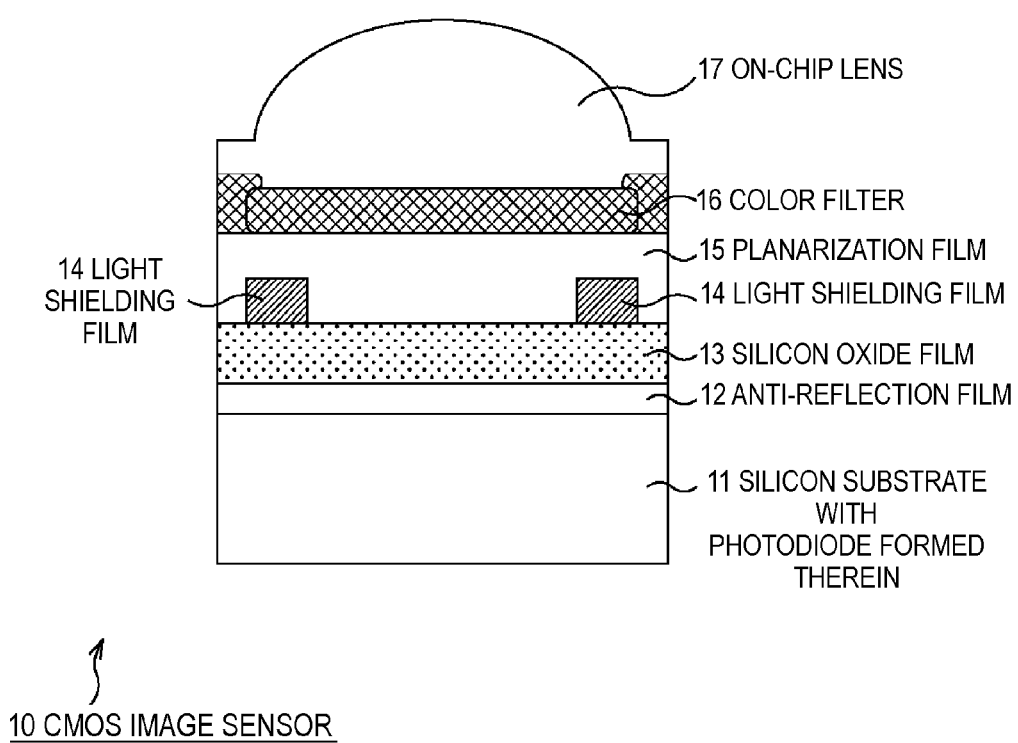
FIG. 1 is an exemplary cross-sectional view of a CMOS image sensor in related art.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The description will be made in the following order.
1. First Embodiment (CMOS Image Sensor)
2. Second Embodiment (Manufacturing Apparatus and Method)
3. Third Embodiment (CMOS Image Sensor)
4. Fourth Embodiment (Manufacturing Apparatus and Method)
5. Fifth Embodiment (CMOS Image Sensor)
6. Sixth Embodiment (Manufacturing Apparatus and Method)
7. Seventh Embodiment (Imaging Apparatus)

1. First Embodiment

CMOS Image Sensor in Related Art

FIG. 1 is a diagram illustrating an exemplary configuration of an image sensor of a back-illuminated type using a complementary metal oxide semiconductor (CMOS) according to the related art. As illustrated in FIG. 1, in the CMOS image sensor 10 according to the related art, an anti-reflection film 12, a silicon oxide film 13, a light shielding film 14, a planarization film 15, a color filter 16, and an on-chip lens 17 are stacked on a back-surface side (the upper side in the figure) of a silicon substrate 11. A photoelectric conversion element such as a photodiode is formed in the silicon substrate 11.

Although not shown, a wiring layer may be formed in a front-surface side (the lower side in the figure) of the silicon substrate 11 having a photodiode formed therein. The wiring layer may include a wiring or the like which is used to read out electrical charge accumulated in a photodiode.

As illustrated in FIG. 1, in the CMOS image sensor 10 according to the related art, a back-surface side of the anti-reflection film 12 is covered with the silicon oxide film with a good interface state. However, in such a structure, it has become difficult to ignore deterioration in the interface state due to moisture as pixels are made to be fine, as described in Non-Patent Document ("Hot-Carrier Aging of the MOS Transistor in the Presence of Spin-on Glass as the Interlevel Dielectric", IEEE ELECTRON DEVICE LETTERS, VOL. 12, NO. 3, MARCH 1991).

Figure 2:
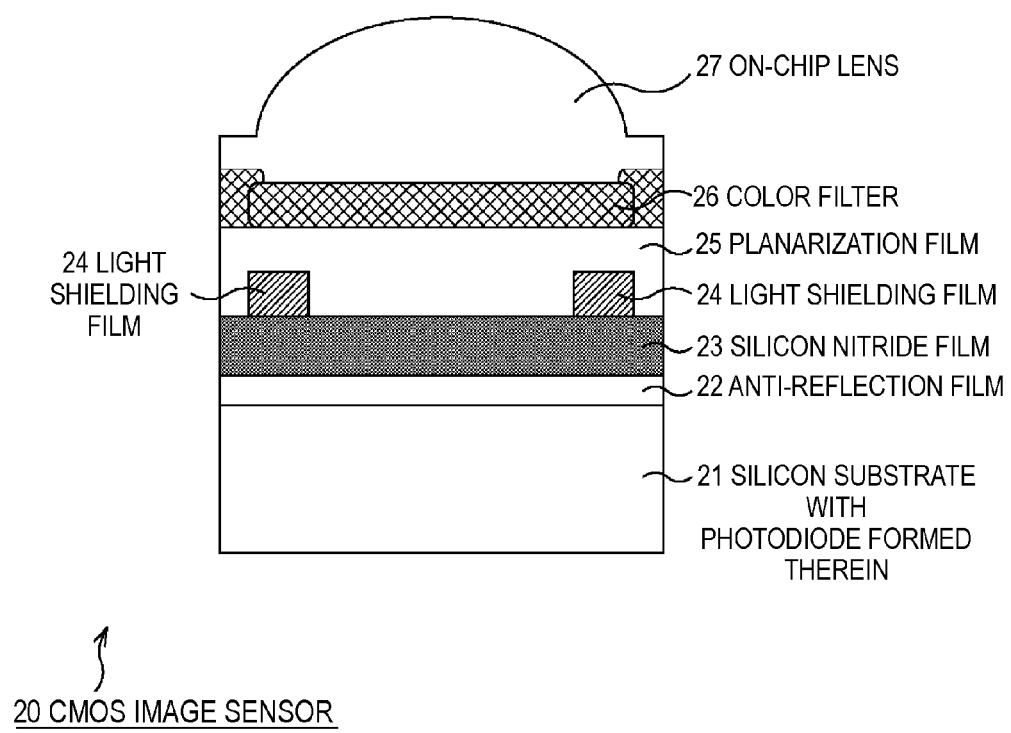
FIG. 2 is an exemplary cross-sectional view of a CMOS image sensor in related art.

Thus, as described in Patent Document (Japanese Unexamined Patent Application Publication No. 2006-196587), a technique for forming a silicon nitride film as a film for preventing penetration of moisture has been considered. FIG. 2 is a diagram illustrating an exemplary configuration of a CMOS image sensor of a case where the above technique is used.

The CMOS image sensor 20 illustrated in FIG. 2 is an image sensor similar to the CMOS image sensor 10 illustrated in FIG. 1, and thus it has a substantially similar configuration to the CMOS image sensor 10. As illustrated in FIG. 2, in the CMOS image sensor 20, an anti-reflection film 22, a silicon nitride film 23, a light shielding film 24, a planarization film 25, a color filter 26, and an on-chip lens 27 are stacked on a back-surface side (the upper side in the figure) of a silicon substrate 21 with a photodiode formed therein.

The silicon substrate 21 with a photodiode formed therein has a configuration and functions similar to those of the silicon substrate 11 with a photodiode formed therein. In addition, the anti-reflection film 22 is a layer similar to the anti-reflection film 12. The light shielding film 24 is a layer similar to the light shielding film 14. The planarization film 25 is a layer similar to the planarization film 15. The color filter 26 is a filter similar to the color filter 16. The on-chip lens 27 is a condensing lens similar to the on-chip lens 17.

However, for the CMOS image sensor 20, instead of the silicon oxide film 13, the silicon nitride film 23 is formed on the back-surface side of the anti-reflection film 22. The silicon nitride film 23 has a higher density than that of the silicon oxide film 13 and thus it can significantly prevent moisture from penetrating into the anti-reflection film 22.

Figure 3:
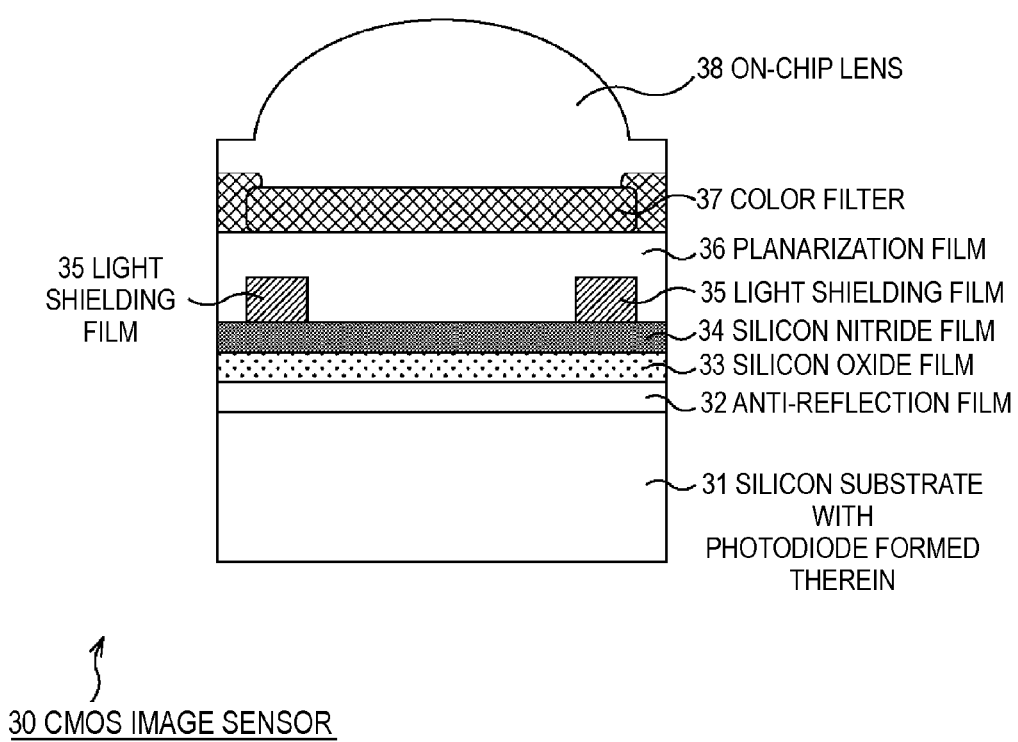
FIG. 3 is an exemplary cross-sectional view of a CMOS image sensor in related art.

Furthermore, as a way for preventing penetration of moisture, for example, as an example illustrated in FIG. 3, a method of forming an additional silicon nitride film on a back-surface side of the silicon oxide film is considered. FIG. 3 is a diagram illustrating another exemplary configuration of the CMOS image sensor in the related art.

The CMOS image sensor 30 illustrated in FIG. 3 is an image sensor similar to the CMOS image sensor illustrated in FIG. 1, and thus it has a substantially similar configuration to the CMOS image sensor 10. As illustrated in FIG. 3, in the CMOS image sensor 30, an anti-reflection film 32, a silicon oxide film 33, a silicon nitride film 34, a light shielding film 35, a planarization film 36, a color filter 37, and an on-chip lens 38 are stacked on a back-surface side (the upper side in the figure) of a silicon substrate 31 with a photodiode formed therein.

The silicon substrate 31 with a photodiode formed therein has a configuration and functions similar to those of the silicon substrate 11 in which a photodiode is formed. In addition, the anti-reflection film 32 is a layer similar to the anti-reflection film 12. The silicon oxide film 33 is a layer similar to the silicon oxide film 13. The light shielding film 35 is a layer similar to the light shielding film 14. The planarization film 36 is a layer similar to the planarization film 15. The color filter 37 is a filter similar to the color filter 16. The on-chip lens 38 is a condensing lens similar to the on-chip lens 17.

However, in the CMOS image sensor 30, the silicon nitride film 34 is further formed on a back-surface side of the silicon oxide film 33. The silicon nitride film 34 has a higher density than that of the silicon oxide film 33 and thus it can significantly prevent penetration of moisture into the anti-reflection film 32.

However, a silicon nitride film has a high refractive index. Thus, as the example of FIG. 2 or FIG. 3, if a silicon nitride film is formed on the back-surface side (the side on which light is incident) of the anti-reflection film, the anti-reflection structure may be collapse, and this could result in reduced transmittance of light and decreased sensitivity of a photodiode. In addition, nitrogen caused during processing or in a silicon nitride film may penetrate into an interface of a silicon substrate, and this could lead to deterioration in an interface state.

<CMOS Image Sensor>

Figure 4:
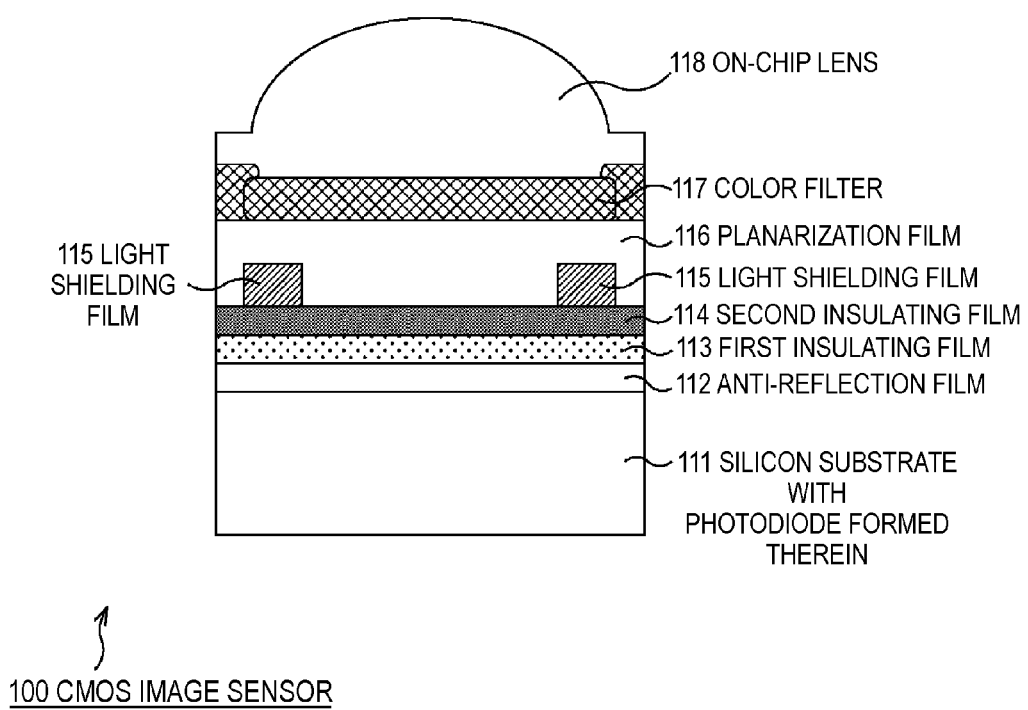
FIG. 4 is an exemplary cross-sectional view of a CMOS image sensor.

FIG. 4 is a diagram illustrating an exemplary configuration of a back-illuminated CMOS image sensor according to an embodiment of an image sensor to which the present technology is applied.

The CMOS image sensor 100 illustrated in FIG. 4 is a back-illuminated CMOS image sensor that converts light incident from the upper side in the figure into electricity and outputs an image as electrical signals (image data). Additionally, in the exemplary configuration of the CMOS image sensor 100, only one pixel is illustrated in FIG. 4, but the CMOS image sensor 100 practically includes a plurality of pixels, for example, which are arranged in an array on a light incident surface. In other words, the CMOS image sensor 100 has a plurality of structures, but only one structure is illustrated in FIG. 4.

As illustrated in FIG. 4, the CMOS image sensor 100 includes a silicon substrate 111 with a photodiode formed therein, an anti-reflection film 112, a first insulating film 113, a second insulating film 114, a light shielding film 115, a planarization film 116, a color filter 117, and an on-chip lens 118.

In the silicon substrate 111 with a photodiode formed therein, a photoelectric conversion element such as a photodiode, which serves as a light receiving unit, is formed on a silicon (Si) substrate. The incident light, which passes through the on-chip lens 118, the color filter 117, the planarization film 116, the second insulating film 114, the first insulating film 113, and the anti-reflection film 112, is received (photoelectrically converted) by a light receiving unit (photodiode) of the silicon substrate 111 with the photodiode formed therein. The photodiode accumulates electric charge obtained by photoelectric conversion of the incident light. This electric charge is read by a circuit including a wire of a wiring layer (not shown) formed on the front-surface side (the lower side in the figure) of the silicon substrate 111 with the photodiode formed therein, and is outputted from the CMOS image sensor 100.

In practice, the CMOS image sensor 100 not only includes a pixel configuration as shown in FIG. 4, but also includes pixel peripheral circuits for reading out electric charge or controller, but the description thereof will be omitted herein.

The anti-reflection film 112 is a layer that reflects incident light at an interface of the silicon substrate 111 with the photodiode formed therein and suppresses reduction in sensitivity of the photodiode. The anti-reflection film 112 has a higher refractive index than that of the first insulating film 113 and has a lower refractive index than that of the silicon substrate 111 with the photodiode formed therein. For example, the anti-reflection film 112 may be made of a silicon nitride film, a silicon oxynitride film, a titanium oxide film, or a tantalum oxide film. In addition, for example, the anti-reflection film 112 may be formed over the entire pixel area of the back-surface side of the silicon substrate 111 with the photodiode formed therein.

The first insulating film 113 is an insulating layer that suppress deterioration in the interface state of the anti-reflection film 112 due to nitrogen from the second insulating film 114. For example, the first insulating film 113 may be made of a silicon oxide film (SiO) which does not contain nitrogen. In addition, the first insulating film 113 may be formed over the entire pixel area of the back-surface side of the anti-reflection film 112.

The second insulating film 114 is an insulating layer that prevents moisture from penetrating into the first insulating film 113 or the anti-reflection film 112. For example, the second insulating film 114 may be made of a silicon oxide film containing nitrogen (hereinafter, referred to as a silicon oxynitride film (SiON)) or a silicon oxide film with a higher density at least than the first insulating film 113 (hereinafter, referred to as a high-quality silicon oxide film (SiO)). In addition, for example, the second insulating film 114 may be formed over the entire pixel area of the back-surface side of the first insulating film 113.

The second insulating film 114 has a refractive index that is set to be substantially equal to, or slightly higher than, that of the first insulating film 113.

The light shielding film 115 is formed between pixels on the back-surface side of the second insulating film 114 to prevent the occurrence of color mixing. Further, the planarization film 116 for smoothing the back-surface side is formed over the entire pixel area. As an example, the light shielding film 115 is made of a light shielding material, such as metal or tungsten, which blocks light from passing through it. The planarization film 116 may be made of a material permitting the passage of light.

Further, the color filter 117 and the on-chip lens 118 are formed on a back-surface side of the planarization film 116. The color filter 117 is a filter that extracts a predetermined wavelength range component such as RGB for each pixel from incident light. The on-chip lens 118 is a condensing lens that condenses incident light for each pixel to improve sensitivity of the light receiving unit (to increase the amount of light).

The incident light that is condensed by the on-chip lens 118 passes through the color filter 17, and thus a predetermined wavelength range component such as RGB is extracted for each pixel. The incident light of the wavelength range component transmits through the planarization film 116 between the light shielding films 115, and subsequently transmits the second insulating film 114, the first insulating film 113, and the anti-reflection film 112 in that order. Subsequently, the light is incident on the photodiode (light receiving unit) of the silicon substrate 111 with the photodiode formed therein, and then it is photoelectrically converted.

As described above, the second insulating film 114 is set to have a higher density at least than the first insulating film 113, and thus the CMOS image sensor 100 can prevent moisture from reaching the interface of the silicon substrate 111 with the photodiode formed therein.

Furthermore, the second insulating film 114 having a higher density than the first insulating film 113 is easily implemented by using the high-quality silicon oxide film (SiO). In addition, it is possible to easily control the density of the silicon oxide film (SiO) when depositing it. In addition, the second insulating film 114 having a higher density than the first insulating film 113 can be implemented by a silicon oxynitride film (SiON). The silicon oxynitride film (SiON) contains nitrogen, and thus, the silicon oxynitride film has a higher density than the silicon oxide film (SiO) by the amount of contained nitrogen. In addition, the density may be easily controlled by using the nitrogen content.

Moreover, in addition to the second insulating film 114 as described above, the first insulating film 113 is formed between the second insulating film 114 and the anti-reflection film 112. Accordingly, in the CMOS image sensor 100, nitrogen from the second insulating film 114 that may contain nitrogen can be prevented from penetrating into the interface of the silicon substrate 111 with the photodiode formed therein, thereby suppressing deterioration in the interface state of the silicon substrate.

Figure 5:
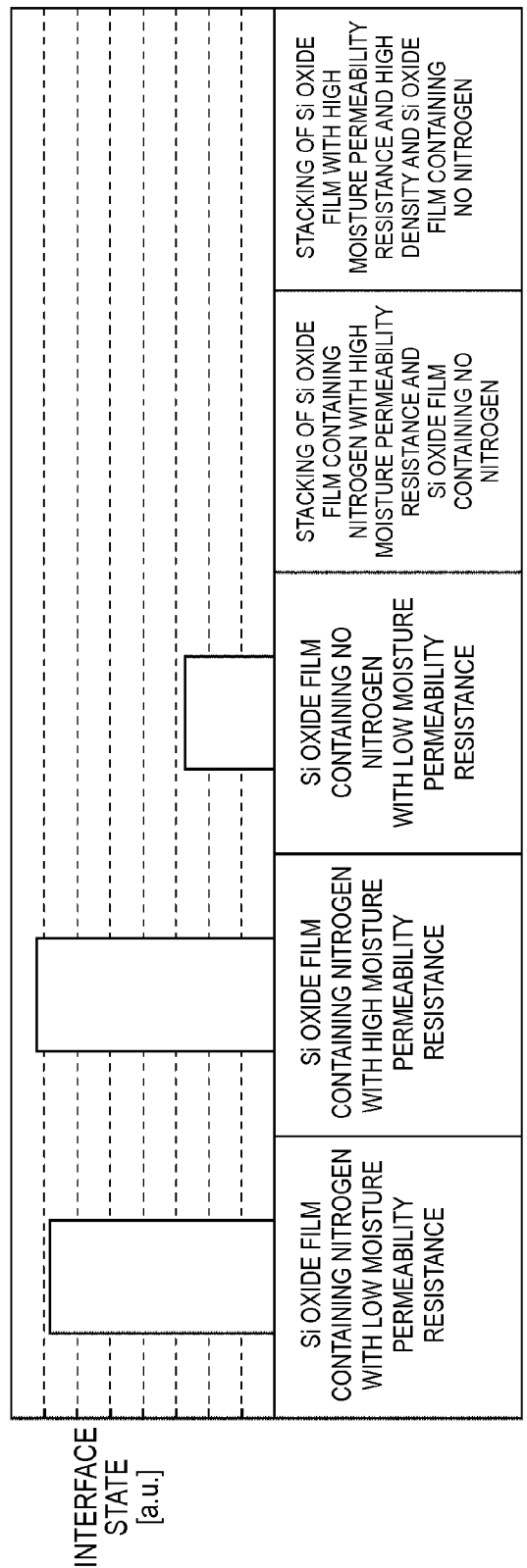
FIG. 5 is a diagram for explanation of an interface state.

FIG. 5 is a diagram showing the results of each case of the interface state. As shown in the bar graph at the leftmost side of FIG. 5, in a case where only a silicon (Si) oxide film with low permeability resistance is formed on the back-surface side of the anti-reflection film 112, the interface state is deteriorated due to penetration of moisture. As shown in the bar graph at the second from the left of FIG. 5, in a case where a silicon (Si) oxide film containing nitrogen with permeability resistance is formed on the back-surface side of the anti-reflection film 112, the interface state is deteriorated due to the effect of nitrogen. As shown in the bar graph at the third from the left of FIG. 5, in a case where a silicon (Si) oxide film containing nitrogen with low permeability resistance is formed on the back-surface side of the anti-reflection film 112, the interface state is deteriorated due to the effect of moisture and nitrogen.

In this regard, as shown in FIG. 4, the first insulating film is set to be a first layer of the front-surface side as a silicon (Si) oxide film containing no nitrogen and the second insulating film is set to be a second layer of the back-surface side as a silicon (Si) oxide film with high density or a silicon (Si) oxide film containing nitrogen, thereby forming a insulating film of a two-layer structure. Accordingly, as shown in the fourth and fifth from the left of FIG. 5, it is possible to suppress deterioration of the interface state to the detectable level or less.

Figure 6:
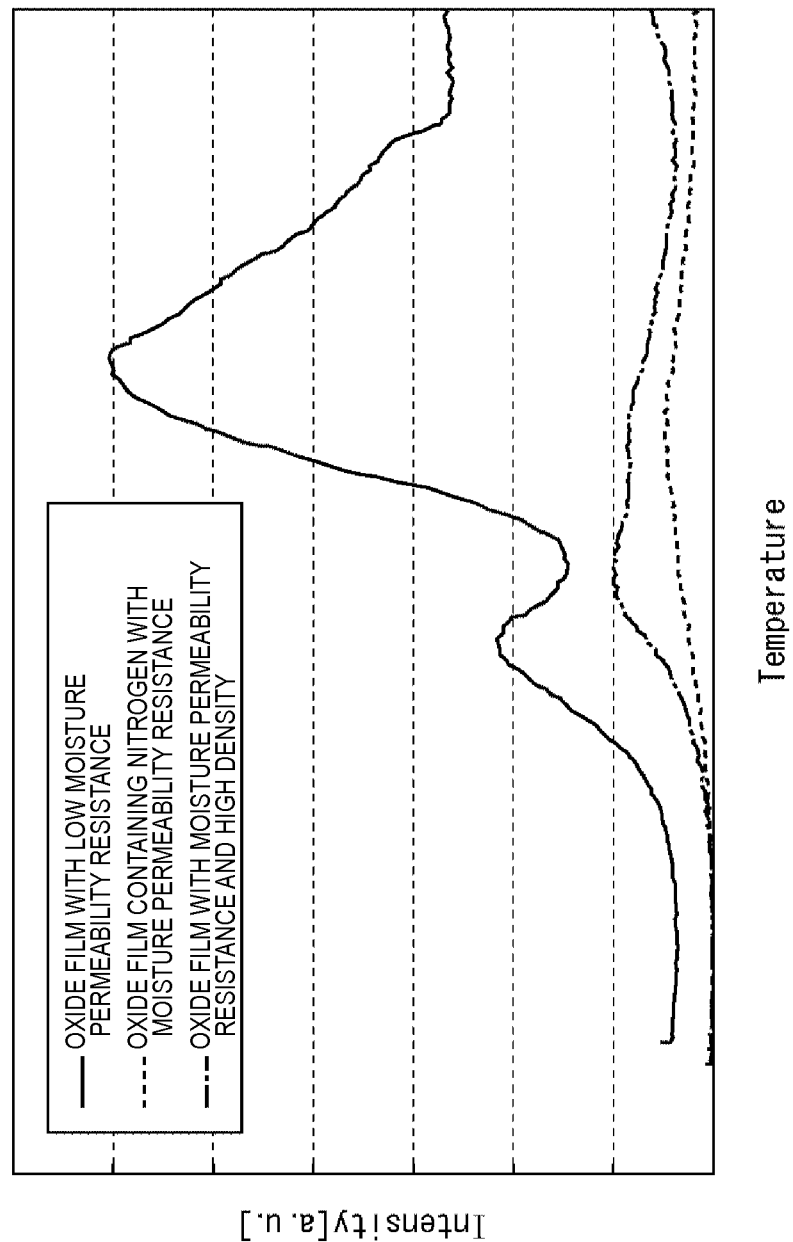
FIG. 6 is a diagram for explanation of properties related to degassing of moisture.

FIG. 6 shows results obtained by degassing of moisture. The graph of FIG. 6 shows results obtained by comparing values obtained by setting each of an oxide film with low permeability resistance, an oxide film containing nitrogen with permeability resistance, and an oxide film with a high density and permeability resistance as a sample, by adding moisture to each sample, by applying heat to each sample, and by measuring the amounts of moisture exuded from each sample.

As shown by a solid curve in FIG. 6, it is found that the degassing amount of moisture due to moisture absorption is large in the oxide film with low permeability resistance. In contrast, the degassing amount of moisture due to moisture absorption is small in the oxide film containing nitrogen with permeability resistance or in the oxide film with permeability resistance and a high density. Thus, as shown in FIG. 4, in the CMOS image sensor 100, the second insulating film with high permeability resistance is stacked on the first insulation film with low permeability resistance, and thus it is possible to suppress the interface state of the silicon substrate 111 with the photodiode formed therein from being deteriorated due to moisture penetration.

Furthermore, the second insulating film 114 has a refractive index that is set to be substantially equal to, or slightly higher than, that of the first insulating film 113. In this way, it is possible to maintain the anti-reflection film structure and suppress reduction in transmittance of incident light by reducing the difference in refractive index between the first insulating film 113 and the second insulating film 114.

As described above, in the CMOS image sensor 100, it is possible to suppress deterioration in the interface state of the silicon substrate interface and also suppress decrease in transmittance of light.

<Excavation Light Shielding>

The anti-reflection film 112, the first insulating film 113, and the second insulating film 114 can be formed in any shape of interfaces. In the example of FIG. 4, the interface of the back-surface side of the silicon substrate 111 with the photodiode formed therein is shown as a plane, but the interface of the silicon substrate 111 with the photodiode formed therein may be a curved shape (with uneven portions).

Figure 7:
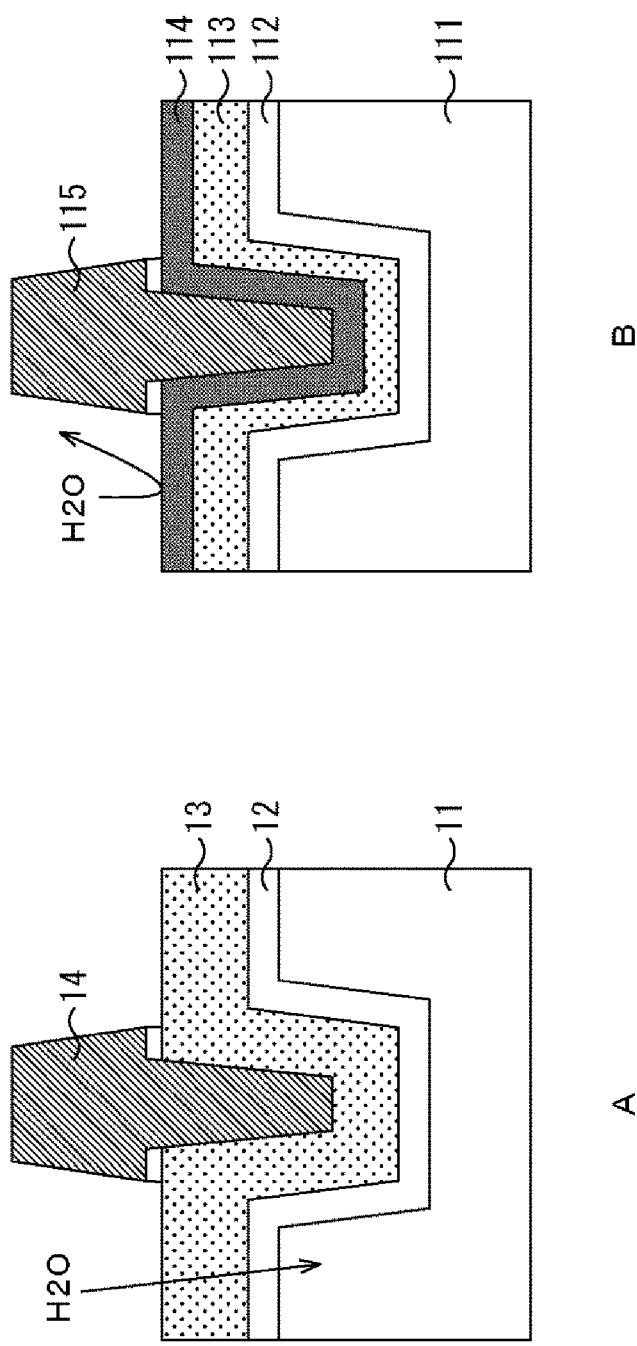
FIG. 7 is a diagram illustrating an example of an excavated light shielding film.

For example, in order to suppress the occurrence of color mixing at a position closer to the photodiode, there is a way referred to as "excavation light shielding", in which a part of the light shielding film is embedded in the silicon substrate. FIG. 7 shows an example of an excavation light shielding. FIG. 7A shows an example of the excavation light shielding by taking the CMOS image sensor 100 of FIG. 1 as an example. As shown in FIG. 7A, in a case of the excavation light shielding, a depression (also referred to as a recess or trench) is formed at a position where the interface of the back-surface side of the silicon substrate 111 with the photodiode formed therein is excavated, and the light shielding film 14 is formed on the trench. By doing so, a part of the light shielding film 14 is embedded into the silicon substrate 111 with the photodiode formed therein, and thus light shielding can be realized at a deeper position, thereby preventing the occurrence of color mixing.

For example, in a case where the excavation light shielding is performed, as shown in FIG. 7B, the anti-reflection film 112, the first insulating film 113, and the second insulating film 114 can be formed in the trench, as in the case of FIG. 4. Thus, according to the CMOS image sensor 100, it is possible to suppress deterioration in the interface state of the silicon substrate interface and suppress the decrease in transmittance of light.

Moreover, in the above, it has been described that the insulating film of two-layer structure including the first insulating film 113 and the second insulating film 114 are formed in the back-surface side of the anti-reflection film 112, but the present embodiment is not limited thereto and a stacked structure of three or more layers is possible. In this case, it is desirable that the density and refractive index of each layer are set to be higher toward the back-surface side from the front-surface side. In addition, instead of the stacked structure, In-Situ deposition may be continuously performed. That is, it may be implemented by an insulating film of one-layer structure including the first insulating film 113 and the second insulating film 114.

For example, the density of the silicon oxide film may be set to be increased toward the back-surface side from the front-surface side continuously or discontinuously without using nitrogen. For example, the silicon oxide film may be preferably deposited while controlling the density to be gradually increased.

Further, for example, the nitrogen content in the silicon oxynitride film may be set to be increased toward the back-surface side from the front-surface side continuously or discontinuously with using nitrogen. For example, the silicon oxynitride film may be preferably deposited while controlling the nitrogen content to be gradually increased. However, in this case, it is necessary to prevent nitrogen from penetrating at the vicinity of the interface of the anti-reflection film 112 and the silicon oxynitride film.

In this case, the refractive index may be also controlled to be gradually increased toward the back-surface side from the front-surface side.

The anti-reflection film 112, the first insulating film 113, and the second insulating film 114 may be also formed on a pixel (also referred to as an optical black (OPB)) which is used to detect a reference value of black level. This pixel is shielded from light. Even in a case of OPB pixel, the anti-reflection film 112, the first insulating film 113, and the second insulating film 114 may be deposited as in the case of a pixel in an effective pixel region.

Therefore, it is possible to reduce the difference in configuration between the OPB pixel and the pixel in the effective pixel region, thereby realizing the detection of a black level reference value with high accuracy.

2. Second Embodiment

Manufacturing

Figure 8:
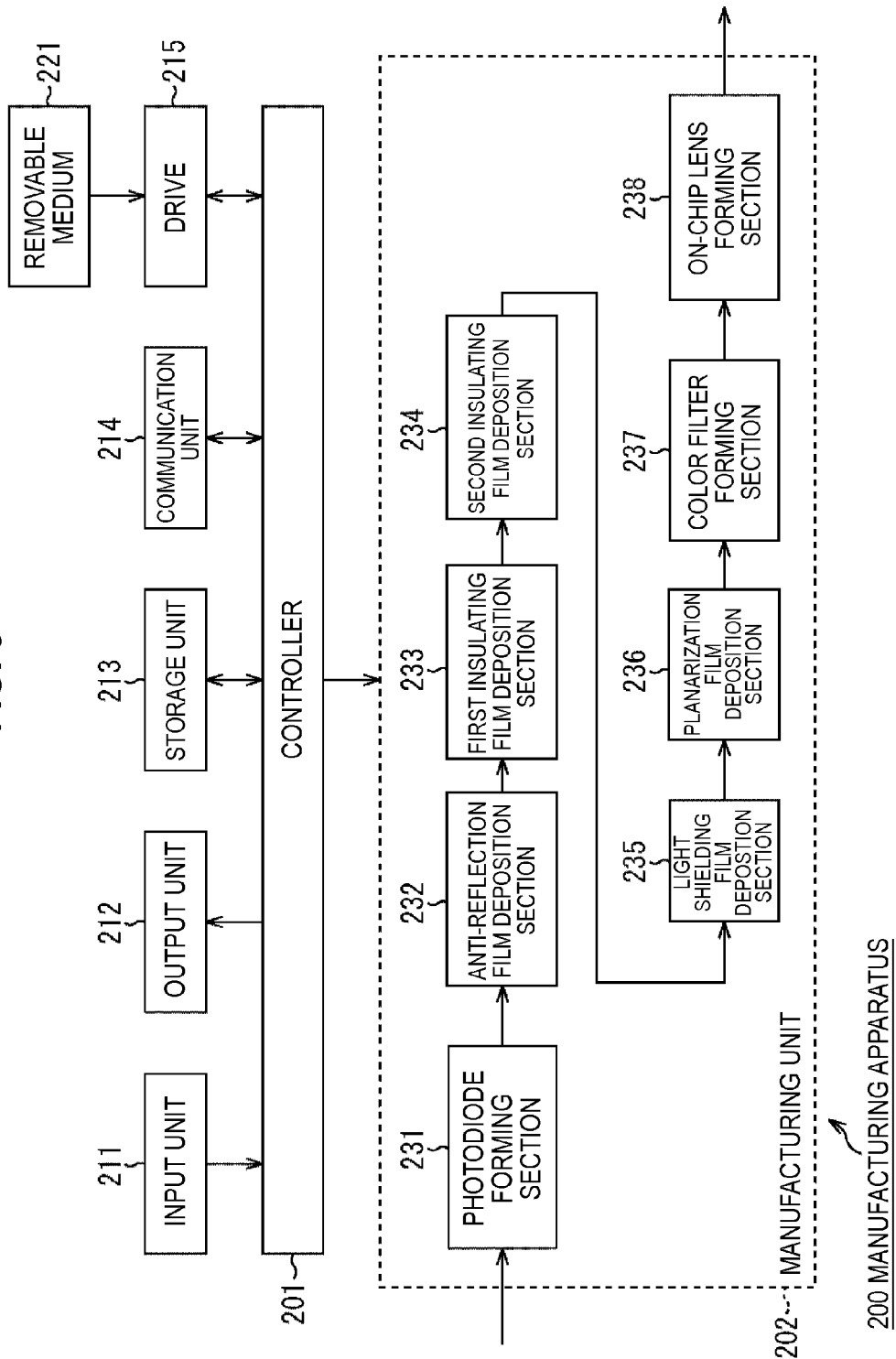
FIG. 8 is a block diagram illustrating exemplary configuration of a manufacturing apparatus.

FIG. 8 is a block diagram illustrating an exemplary configuration of a manufacturing apparatus as an embodiment of the manufacturing apparatus to which the present technology is applied. The manufacturing apparatus 200 illustrated in FIG. 8 is an apparatus for manufacturing the CMOS image sensor 100, and includes a controller 201 and a manufacturing unit 202.

The controller 201 may include a central processing unit (CPU), a read only memory (ROM), a random access memory (RAM), and so on. The controller 201 controls each components of the manufacturing unit 202 and performs a control process for manufacturing the CMOS image sensor 100. For example, the CPU of the controller 201 executes various processes according to the program stored in the ROM. In addition, the CPU executes various processes according to the program loaded into the RAM from the storage unit 213. Additionally, the RAM appropriately stores data necessary for the CPU to execute various processes.

The manufacturing unit 202 is controlled by the controller 201 and performs a process for manufacturing the CMOS image sensor 100. The manufacturing unit 202 may include a photodiode forming section 231, a anti-reflection film deposition section 232, a first insulating film deposition section 233, a second insulating film deposition section 234, a light shielding film deposition section 235, a planarization film deposition section 236, a color filter forming section 237, and an on-chip lens forming section 238. These components from the photodiode forming section 231 to the on-chip lens forming section 238 are controlled by the controller 201 and perform a process of each step for manufacturing an image sensor (CMOS image sensor 100) as described later.

For convenience of description, only steps related to an embodiment of the present technology will be described herein. In practice, in order to manufacture the CMOS image sensor 100, steps other than those performed by these components are necessary and the manufacturing unit 202 may include a processing unit for the other steps. However, the other steps are similar to those necessary for the case of manufacturing a general CMOS image sensor, and thus detailed descriptions of the other steps will be omitted herein.

The manufacturing apparatus 200 may include an input unit 211, an output unit 212, a storage unit 213, a communication unit 214, and a drive 215.

The input unit 211 may include a keyboard, a mouse, a touch panel, an external input terminal, or the like. The input unit 211 receives a user instruction or information from the external and supplies it to the controller 201. The output unit 212 may include a display such as cathode ray tube (CRT) display or liquid crystal display (LCD), a speaker, an external output terminal, or the like. The output unit 212 outputs various types of information supplied from the controller 201 as images, sounds, or an analog signal or digital data.

The storage unit 213 may include a solid-state drive (SSD) such as a flash memory, a hard disk, or the like. Information supplied from the controller 201 is stored in the storage unit 213. The storage unit 213 reads and supplies the stored information in response to the request from the controller 201.

The communication unit 214 may include an interface or modem for a wired local area network (LAN) or wireless LAN. The communication unit 214 performs a communication process with external devices via a network including the Internet. For example, the communication unit 214 transmits information supplied from the controller 201 to a communication partner and supplies information received from the communication partner to the controller 201.

The drive 215 is connected to the controller 201 as necessary. A removable medium 221 such as a magnetic disk, an optical disk, a magnet-optic disk, or a semiconductor memory is suitably attached to the drive 215. A computer program read out from the removable medium 221 via the drive 215 is installed in the storage unit 213 as necessary.

Referring to the flowchart of FIG. 9, an exemplary flow of manufacturing process will be described. In addition, the description will be given with reference to FIGS. 10 to 13 as appropriate. FIGS. 10 to 13 are diagrams for explaining each step for the manufacturing process.

When the manufacturing process is started, in step S101, the photodiode forming section 231 forms a photodiode or the like on a semiconductor substrate prepared from the external under the control of the controller 201.

In step S102, the anti-reflection film deposition section 232 deposits the anti-reflection film 112 on the silicon substrate 111 with the photodiode formed therein under the control of the controller 201. For example, the anti-reflection film 112 may be deposited by chemical vapor deposition (CVD).

Figure 10:
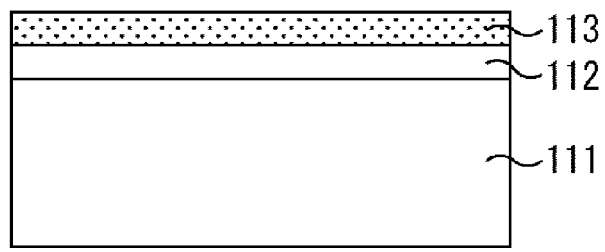
FIG. 10 is a diagram for explaining a step in the manufacturing process.

In step S103, the first insulating film deposition section 233 deposits a silicon (Si) oxide film which is the first insulating film 113 containing no nitrogen in a state where an insulating film serving as an anti-reflection film is formed on the interface of the back-surface side of the silicon substrate 111 with the photodiode formed therein (FIG. 10). This is performed under the control of the controller 201. For example, the first insulating film deposition section 233 deposits a silicon (Si) oxide film containing no nitrogen with a thickness of approximately 10 nanometers (nm) to 500 nm as the first insulating film 113. Examples of the deposition method may include plasma CVD, high-density plasma CVD, thermal CVD (atmospheric pressure CVD or sub-atmospheric pressure CVD), atomic layer deposition (ALD), or the like. The deposition temperature is, for example, 400° C. or less. In addition, examples of the oxidation gas to be used may include gases such as $O_2$, $O_3$, $CO_2$, and so on, which does not contain nitrogen.

Figure 11:
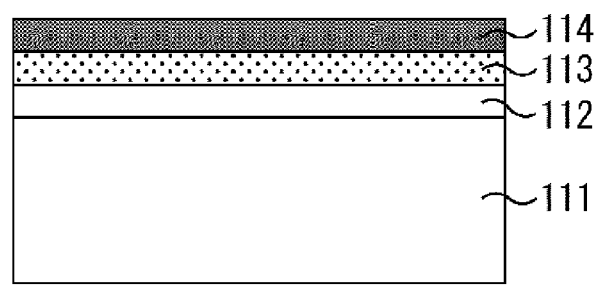
FIG. 11 is a diagram for explaining a step in the manufacturing process.

In step S104, the second insulating film deposition section 234 deposits the second insulating film 114 on the back-surface side of the first insulating film 113 under the control of the controller 201 (FIG. 11). For example, the second insulating film deposition section 234 deposits a silicon (Si) oxide film having a high density or a silicon (Si) oxynitride film containing nitrogen with a thickness of approximately 10 nanometers (nm) to 500 nm as the second insulating film 114. As the deposition method, plasma CVD, high-density plasma CVD, thermal CVD (atmospheric pressure CVD or sub-atmospheric pressure CVD), ALD, or the like may be used. The deposition temperature is, for example, 400° C. or less. In addition, as an oxidation gas or a precursor, the gas containing nitrogen can be used. Examples of the oxidation gas may include gases such as $O_2$, $O_3$, $CO_2$, $N_2O$ or the like. In addition, as the nitride species, gas such as $N_2O$, $NH_3$, $N_2$ may be used. The second insulating film 114 has a refractive index that is set to be substantially equal to that of the first insulating film 113, or there is a slight difference between the two (for example, the difference in refractive index between them is approximately 0.01 to 0.1). Because the difference in refractive index between the first insulating film 113 and the second insulating film 114 is approximately 0.01 to 0.1, it is possible to suppress the decrease in transmittance of light. In addition, a layered structure of the first insulating film 113 and the second insulating film 114 makes it possible to increase moisture permeability resistance and suppress deterioration of interface state.

Figure 12:
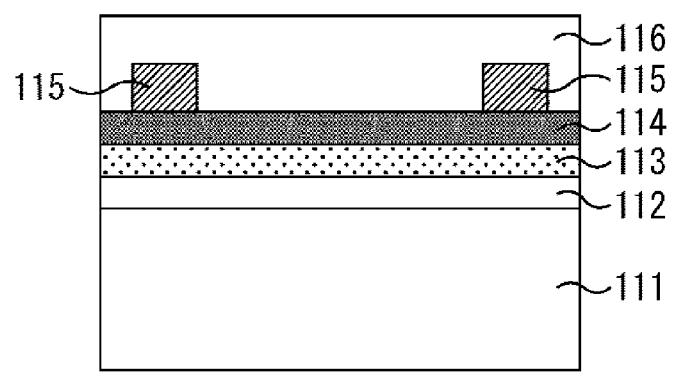
FIG. 12 is a diagram for explaining a step in the manufacturing process.

In step S105, the light shielding film deposition section 235 deposits the light shielding film 115 near boundary with a neighboring pixel (between pixels) on the back-surface side of the second insulating film 114. In step S106, the planarization film deposition section 236 deposits the planarization film 116 on the back-surface side of the second insulating film 114 on which the light shielding film 115 is deposited (FIG. 12).

Figure 13:
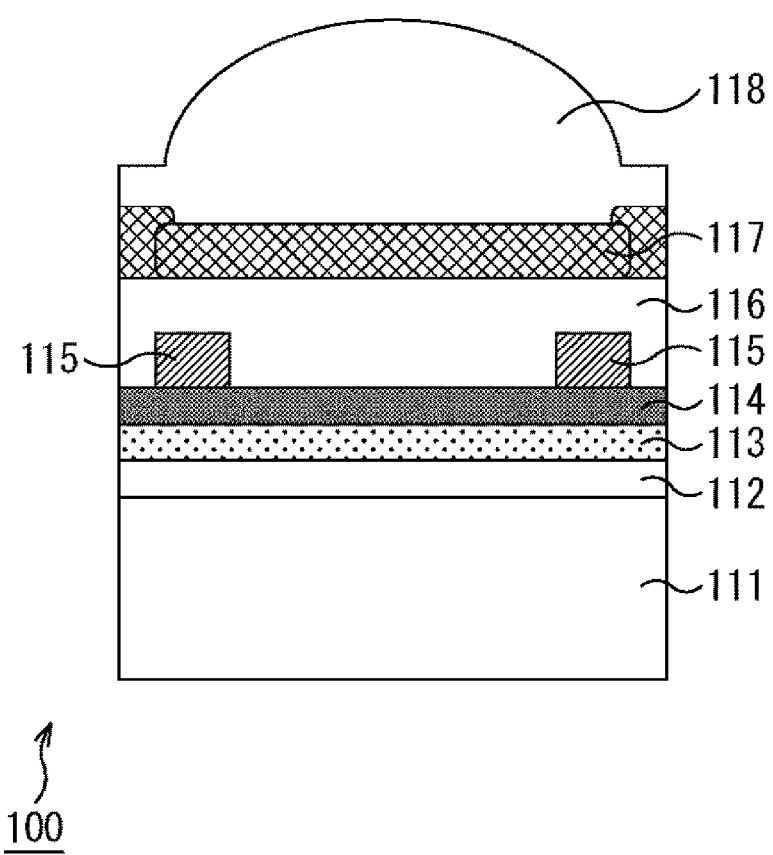
FIG. 13 is a diagram for explaining a step in the manufacturing process.

In step S107, the color filter forming section 237 forms the color filter 117 on the back-surface side of the planarization film 116. In step S108, the on-chip lens forming section 238 forms the on-chip lens 118 on the back-surface side of the color filter 117 (FIG. 13).

The CMOS image sensor 100 is manufactured in the manner described above. If the process of step S108 is completed, the manufacturing process is finished. In practice, thereafter, for example, wiring layer or the like is formed.

As described above, the manufacturing apparatus 200 is capable of manufacturing the CMOS image sensor 100. In other words, the manufacturing apparatus 200 can manufacture the image sensor that can suppress deterioration of an interface state of the silicon substrate interface and suppress decrease in transmittance of light. In addition, as described above, the manufacturing apparatus 200 can easily manufacture the CMOS image sensor 100 without using a special or complicated manufacturing method. Thus, on the back-surface side of the anti-reflection film 112, the manufacturing apparatus 200 can easily deposit a silicon oxide film having a refractive index lower than a silicon nitride film and having a higher density in the back-surface side than in the front-surface side. Accordingly, the manufacturing apparatus 200 is able to suppress reduction in the yield of the CMOS image sensor 100.

3. Third Embodiment

CMOS Image Sensor

Figure 14:
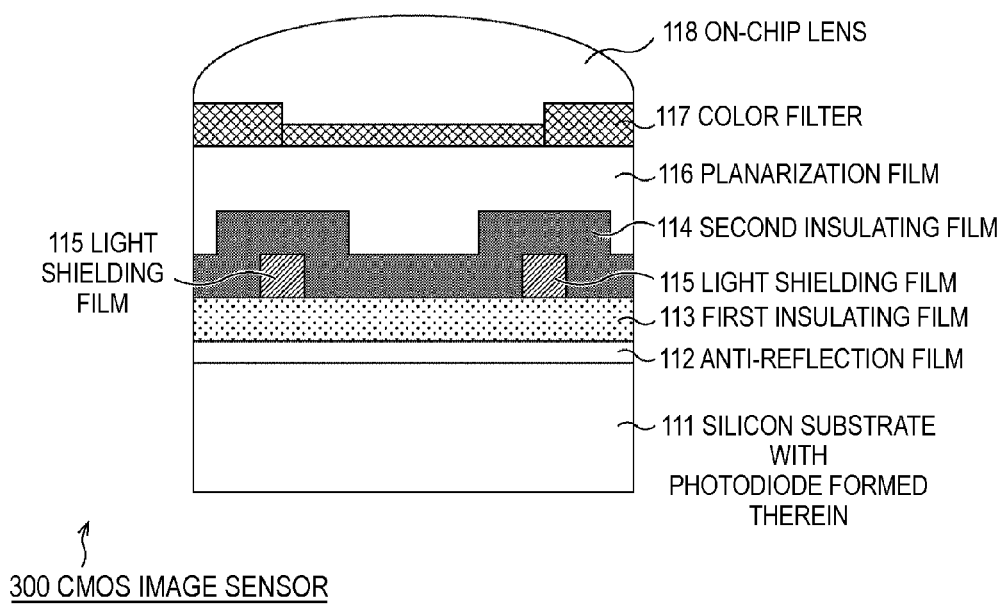
FIG. 14 is another exemplary cross-sectional view of the CMOS image sensor.

In the CMOS image sensor, the second insulating film may be stacked on the upper side (the side facing the on-chip lens) of the patterned light shielding film. FIG. 14 is a diagram illustrating another exemplary configuration of the back-illuminated CMOS image sensor according to an embodiment of the image sensor to which the present technology is applied.

The CMOS image sensor 300 illustrated in FIG. 14 is an image sensor similar to the CMOS image sensor 100 illustrated in FIG. 4, and thus it has a substantially similar configuration to the CMOS image sensor 10. However, in the CMOS image sensor 300, the second insulating film 114 is deposited on the upper side (the side facing the on-chip lens 118) of the patterned light shielding film 115. In other words, the light shielding film 115 is formed between the first insulating film 113 and the second insulating film 114.

Such a configuration makes it possible to make thin the interlayer film at the lower side (the side facing the silicon substrate 111 with the photodiode formed therein) of the light shielding film 115 in the CMOS image sensor 300 than in the CMOS image sensor 100.

In the case of the CMOS image sensor 100 (FIG. 4), the first insulating film 113 and the second insulating film 114 are stacked (a multi-layer insulating film) on the lower side (the side facing the silicon substrate 111 with the photodiode formed therein) of the light shielding film 115. Thus, there is a possibility that the total film thickness of the insulating film is made thicker than the case of single-layer insulating film. If the film thickness of the insulating film is too thick, color mixing may be deteriorated.

Meanwhile, the CMOS image sensor 300 having the configuration (FIG. 14) described above allows the interlayer film on the lower side (the side facing the silicon substrate 111 with the photodiode formed therein) of the light shielding film 115 to be thinner than the case of CMOS image sensor 100. Thus, CMOS image sensor 300 allows the occurrence of color mixing to be suppressed while maintaining the passivation property or interface state as compared with the case of the CMOS image sensor 100.

4. Fourth Embodiment

Manufacturing

Figure 15:
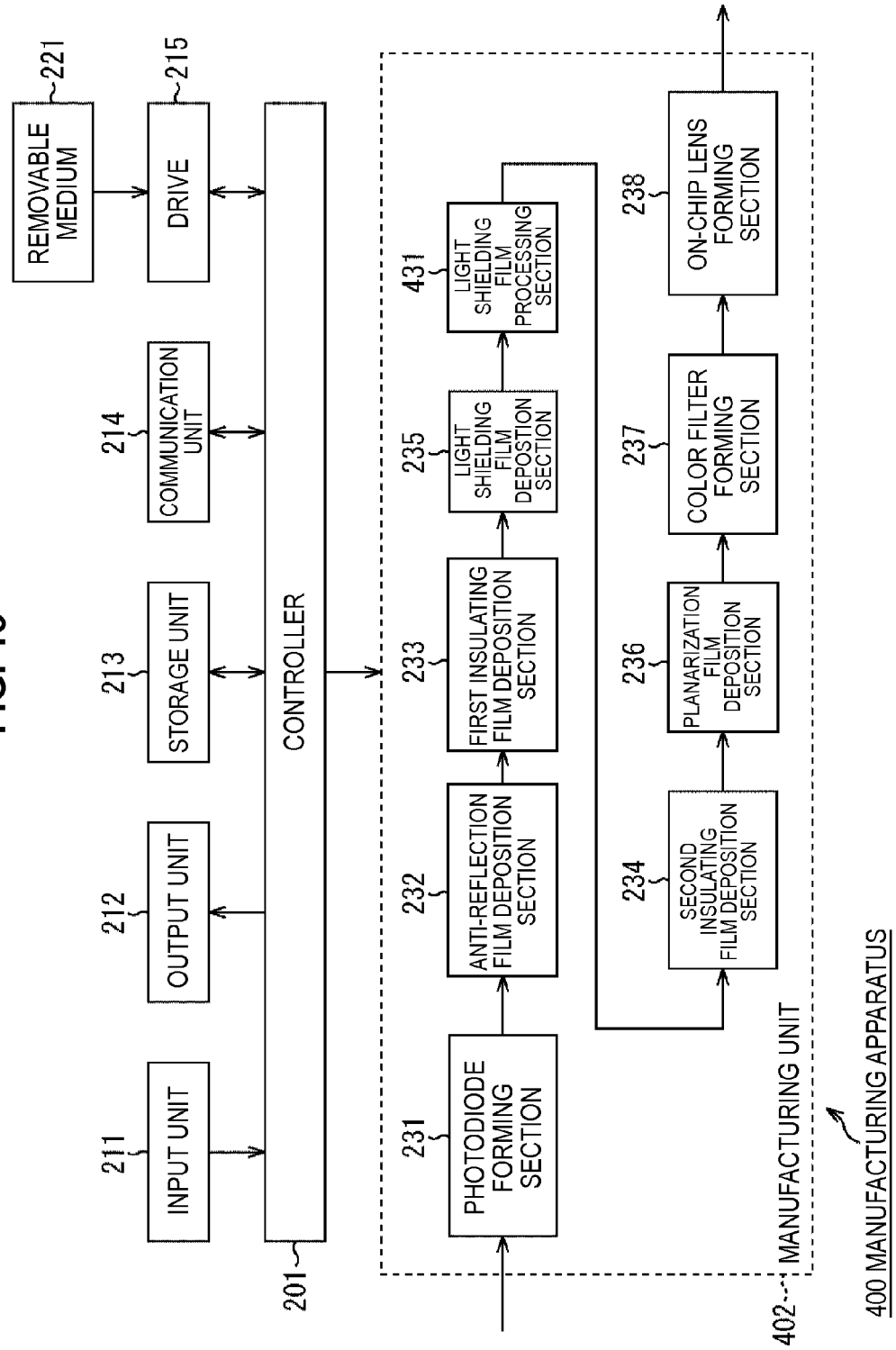
FIG. 15 is a block diagram illustrating another exemplary configuration of the manufacturing apparatus.

FIG. 15 is a block diagram illustrating an exemplary configuration of the manufacturing apparatus as an embodiment of the manufacturing apparatus to which the present technology is applied. The manufacturing apparatus 400 illustrated in FIG. 15 is the manufacturing apparatus for manufacturing the CMOS image sensor 300. As illustrated in FIG. 15, the manufacturing apparatus 400 has a similar configuration to the manufacturing apparatus 200 (FIG. 8).

Specifically, the manufacturing apparatus 400 includes a controller 201, an input unit 211, an output unit 212, a storage unit 213, a communication unit 214, and a drive 215, as similar to the manufacturing apparatus 200. A removable medium 221 is suitably attached to the drive 215.

However, the manufacturing apparatus 400 includes a manufacturing unit 402 instead of the manufacturing apparatus 202. The manufacturing unit 402 performs a process of manufacturing the CMOS image sensor 300 under the control of the controller 201.

As illustrated in FIG. 15, the manufacturing unit 402 has a similar configuration to the manufacturing unit 202. For example, the manufacturing unit 402 includes a photodiode forming section 231, a anti-reflection film deposition section 232, a first insulating film deposition section 233, a second insulating film deposition section 234, a light shielding film deposition section 235, a planarization film deposition section 236, a color filter forming section 237, and an on-chip lens forming section 238.

However, although it will be described in detail later, in the case of the manufacturing unit 402, a device processed by the first insulating film deposition section 233 is supplied to the light shielding film deposition section 235. In addition, the manufacturing unit 402 further includes a light shielding film processing section 431. The device processed by the light shielding film deposition section 235 is supplied to the light shielding film processing section 431. The device processed by the light shielding film processing section 431 is supplied to the second insulating film deposition section 234. The device processed by the second insulating film deposition section 234 is supplied to the planarization film deposition section 236.

These processing sections (from the photodiode forming section 231 to the on-chip lens forming section 238, and the light shielding film processing section 431) of the manufacturing unit 402 perform the respective processes of manufacturing the image sensor (CMOS image sensor 300) under the control of the controller 201, as described later.

Referring to the flowchart of FIG. 16, an exemplary flow of the manufacturing process to be performed by the manufacturing apparatus 400 will be described. The description will be given with reference to FIGS. 17 to 20 as appropriate. FIGS. 17 to 20 are diagrams for explaining each step of the manufacturing process.

Figure 9:
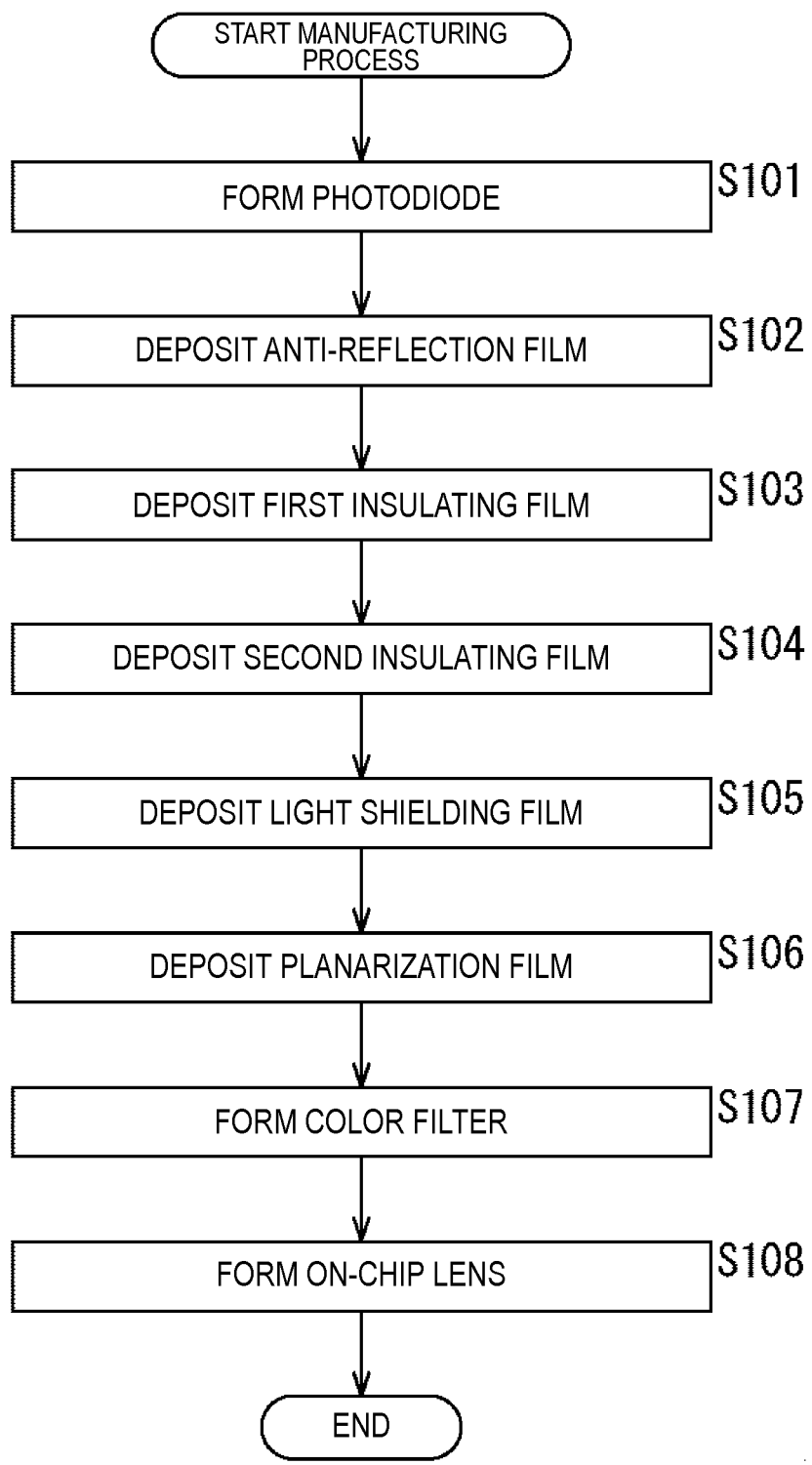
FIG. 9 is a flowchart for explaining an exemplary procedure of a manufacturing process.
Figure 17:
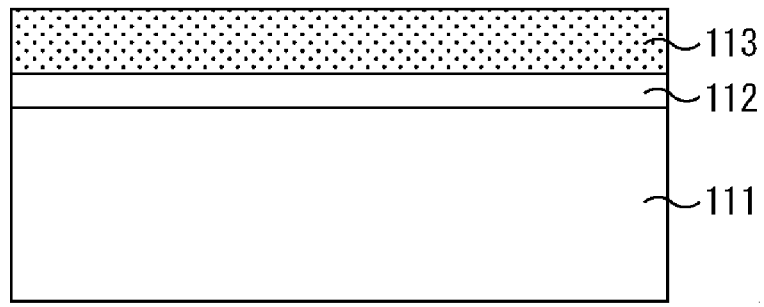
FIG. 17 is a diagram for explaining a step in the manufacturing process.
Figure 18:
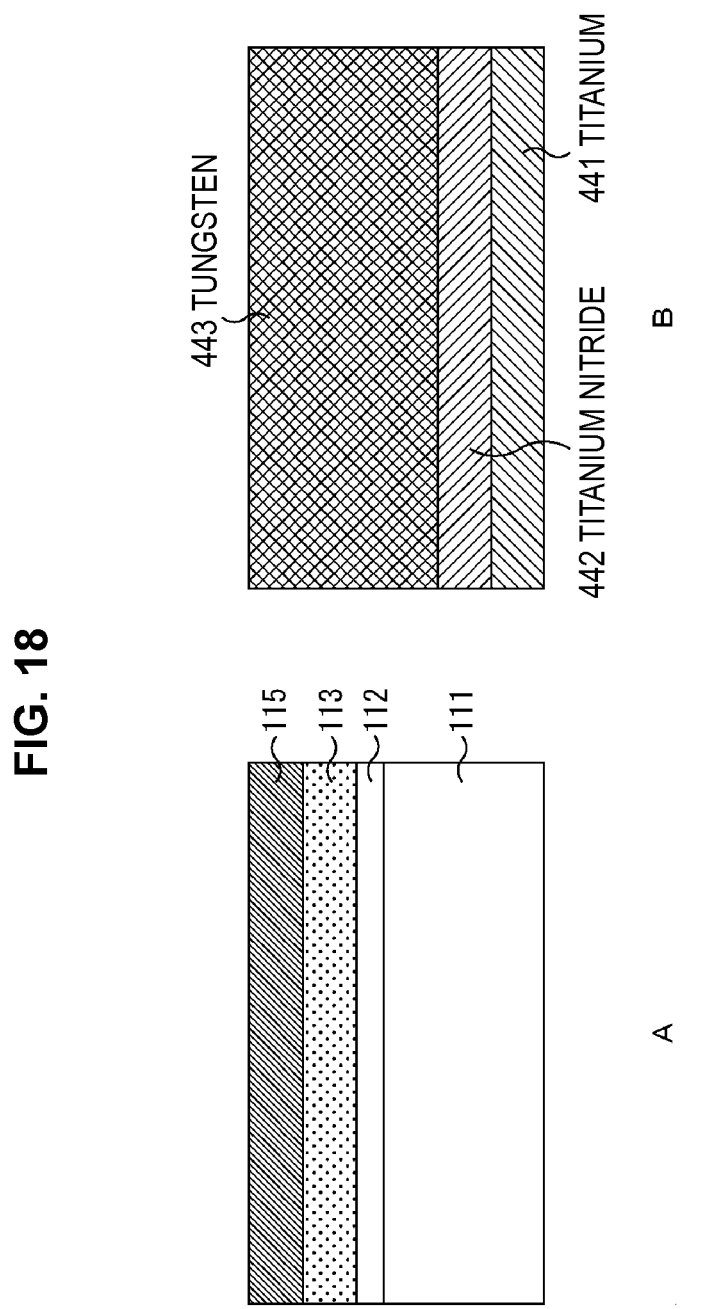
FIG. 18 is a diagram for explaining a step in the manufacturing process.
Figure 19:
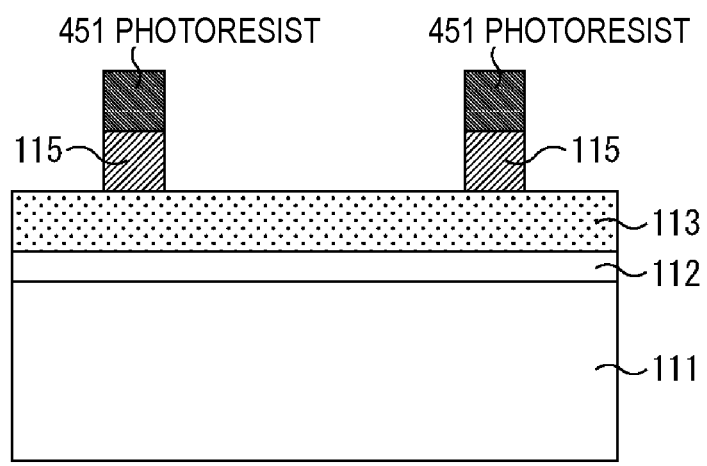
FIG. 19 is a diagram for explaining a step in the manufacturing process.

When the manufacturing process is started, each process of steps S401 to S403 is performed in a similar manner to each process of steps S101 to S103 in FIG. 9. That is, a silicon dioxide film ($SiO_2$) which is the first insulating film 113 containing no nitrogen is deposited in a state where the anti-reflection film 112 is formed on the interface of the back-surface side of the silicon substrate 111 with the photodiode formed therein (FIG. 17).

Examples of materials of the anti-reflection film 112 may include hafnium oxide ($HfO_2$), tantalum pentoxide ($Ta_2O_5$), titanium oxide ($TiO_2$), zirconium oxide ($ZrO_2$), or the like. The materials of the anti-reflection film 112 may be optional and are not limited to this example. In addition, the film thickness of the anti-reflection film 112 may range from a few nanometers (nm) to a few tens of nanometers. The film thickness of the anti-reflection film 112 may be optional and are not limited to this example. Examples of the deposition method of the anti-reflection film 112 may include sputtering, CVD, ADL, or the like. The deposition method of the anti-reflection film 112 may be optional and are not limited to this example.

The film thickness of the first insulating film 113 containing no nitrogen (a silicon dioxide film ($SiO_2$)) may range from a few tens of nanometers (nm) to 100 nm. The film thickness of the first insulating film 113 may be optional and are not limited to this example. Examples of the deposition method of the first insulating film 113 may include sputtering, CVD, ADL, or the like. The deposition method of first insulating film 113 may be optional and are not limited to this example.

In step S404, the light shielding film deposition section 235 deposits the light shielding film 115 on the back-surface side of the first insulating film 113 under the control of the controller 201 (FIG. 18A). The light shielding film 115 is made of, for example, a stacked structure of a titanium film (Ti) 441, a titanium nitride film (TiN) 442, and a tungsten film (W) 443, as shown in FIG. 18B.

In this case, the light shielding film deposition section 235 deposits the titanium film (Ti) 441 and the titanium nitride film (TiN) 442 as a barrier metal (the metal film used for prevention of diffusion or interaction of metallic material) on the back-surface side of the first insulating film 113. For example, the light shielding film deposition section 235 deposits the titanium film (Ti) 441 with a thickness of approximately 10 nanometers (nm) by sputtering, and deposits the titanium nitride (TiN) 442 with a thickness of approximately 10 nm by MOCVD. Then, the light shielding film deposition section 235 deposits the tungsten film (W) 443 on the back-surface side of the titanium nitride (TiN) 442. For example, the light shielding film deposition section 235 deposits the tungsten film (W) 443 with a thickness of approximately 200 nm by CVD.

The configuration of the light shielding film 115, or a film thickness or deposition method of each layer constituting the light shielding film 115 are optional, and are not limited to examples described above.

In step S405, the light shielding film processing section 431 processes the light shielding film 115 through a resist mask. With this processing of the light shielding film 115 (particularly, the tungsten film (W) 443), a portion near boundary with a neighboring pixel (between pixels) is remained, and the other portions are removed, as the example shown in FIG. 19. After this processing, the light shielding film processing section 431 removes the remained photoresist 451.

Figure 20:
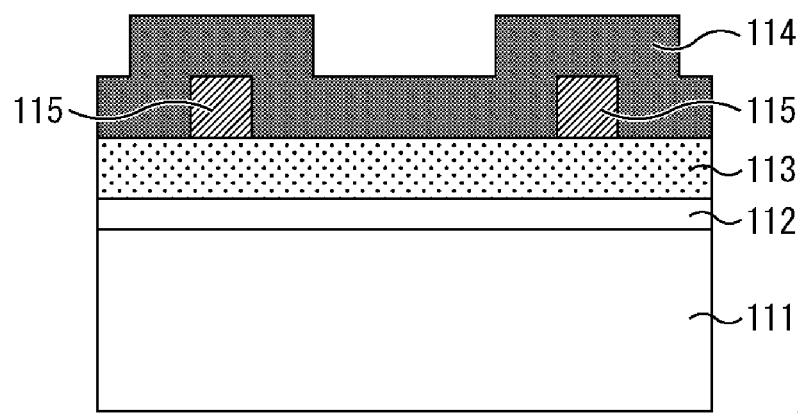
FIG. 20 is a diagram for explaining a step in the manufacturing process.

In step S406, the second insulating film deposition section 234 deposits the second insulating film 114 on the back-surface side of the patterned light shielding film 115 under the control of the controller 201 (FIG. 20). For example, the second insulating film deposition section 234 deposits a silicon oxynitride film (SiON) as the second insulating film 114 with a thickness of a few tens of nanometers (nm) to 100 nm, and this deposition is performed by CVD. The configuration, film thickness, and deposition method of the second insulating film 114 are optional, and are not limited to the examples described above. For example, this deposition process may be performed in a similar manner to the case of step S104 of FIG. 9.

Similarly, according to the configuration described above, as illustrated in FIG. 14, the portion through which incident light transmits is a stacked structure similar to the CMOS image sensor 100. This stacked structure includes the first insulating film 113 and the second insulating film 114. Thus, it is possible to increase moisture permeability resistance and suppress deterioration of an interface state, as similar to the case of CMOS image sensor 100. In addition, the second insulating film 114 has a refractive index that is set to be substantially equal to that of the first insulating film 113, or there is a slight difference between the two (for example, the difference in refractive index between them is approximately 0.01 to 0.1). Thus, it is possible to suppress the decrease in transmittance of light.

Furthermore, it is possible for the interlayer film on the lower side (the side facing the silicon substrate 111 with the photodiode formed therein) of the light shielding film 115 to be thinner than the case of CMOS image sensor 100. Thus, the occurrence of color mixing can be suppressed as compared with the case of the CMOS image sensor 100.

After the process of step S406 is completed, processes of steps S407 to S409 are performed in a similar manner to the processes of steps S106 to S108, respectively. The planarization film 116, the color filter 117, and the on-chip lens 118 are formed. Then, the CMOS image sensor 300 is manufactured (FIG. 14). If the process of step S409 is completed, the manufacturing process is finished. In practice, thereafter, for example, wiring layer or the like is formed.

As described above, the manufacturing apparatus 400 is capable of manufacturing the CMOS image sensor 300. In other words, the manufacturing apparatus 400 can manufacture the image sensor which can suppress deterioration of an interface state of the silicon substrate interface and suppress the occurrence of color mixing while suppressing the decrease in transmittance of light.

In addition, as described above, the manufacturing apparatus 400 can easily manufacture the CMOS image sensor 300 without using a special or complicated manufacturing method. Thus, on the back-surface side of the anti-reflection film 112, the manufacturing apparatus 400 can easily deposit a silicon oxide film having a refractive index lower than a silicon nitride film and having a higher density in the back-surface side than in the front-surface side. Accordingly, the manufacturing apparatus 400 is able to suppress the reduction in the yield of the CMOS image sensor 300.

5. Fifth Embodiment

CMOS Image Sensor

Figure 21:
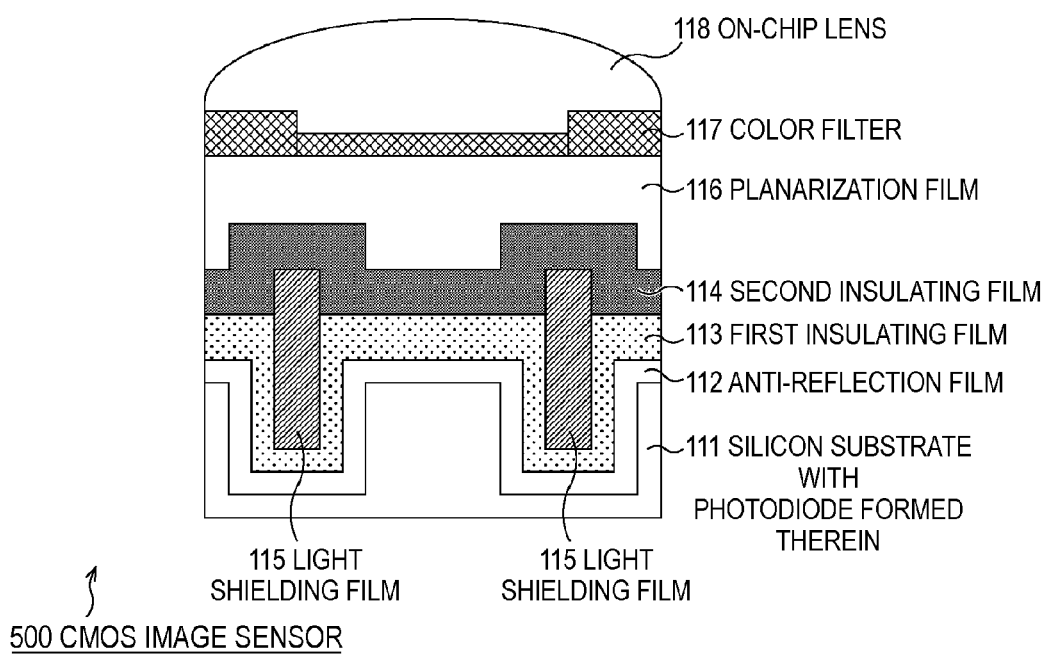
FIG. 21 is still another exemplary cross-sectional view of the CMOS image sensor.

Even in the case that the excavation light shielding is performed as described in the first embodiment (FIG. 7), the second insulating film may be stacked on the upper side (the side facing the on-chip lens) of the patterned light shielding film. FIG. 21 is a diagram illustrating another exemplary configuration of the back-illuminated CMOS image sensor according to an embodiment of the image sensor to which the present technology is applied.

The CMOS image sensor 500 illustrated in FIG. 21 is an image sensor similar to the CMOS image sensor 300 of FIG. 14, and thus it has a substantially similar configuration to the CMOS image sensor 300. However, in the CMOS image sensor 500, the excavation light shielding is performed as described with reference to FIG. 7, and thus a portion of the light shielding film 115 is embedded into the silicon substrate 111 with the photodiode formed therein.

As described with reference to FIG. 7, when the excavation light shielding is performed, if the thickness of the insulating film becomes thicker, the film thickness to be embedded into the trench of the silicon substrate 111 with the photodiode formed therein increases, and accordingly it may be necessary to widen the trench width. Thus, the portion through which the photodiode receives incident light between the patterned light shielding films 115 may be reduced in size. If the area size of the portion is too small, the sensitivity may be lowered.

Meanwhile, the CMOS image sensor 500 having the configuration (FIG. 21) described above allows the interlayer film on the lower side (the side facing the silicon substrate 111 with the photodiode formed therein) of the light shielding film 115 to be thinner than the case of CMOS image sensor 100. Thus, the CMOS image sensor 500 allows the trench of the silicon substrate 111 with the photodiode formed therein to be smaller in width than the case of the CMOS image sensor 100 in which the embedded light shielding is performed. For this reason, the CMOS image sensor 500 can prevent the size of the portion through which the photodiode receives incident light between the patterned light shielding films 115 from being reduced. Thus, the CMOS image sensor 500 can maintain the passivation property or interface state as compared with the case of the CMOS image sensor 100 in which the embedded light shielding is performed, and can prevent the decrease in sensitivity as compared with the case of the CMOS image sensor 100 in which the excavation light shielding is performed.

The CMOS image sensor 500 allows the interlayer film on the lower side (the side facing the silicon substrate 111 with the photodiode formed therein) of the light shielding film 115 to be thinner than the case of CMOS image sensor 100, as similar to the case of the CMOS image sensor 300. Thus, the CMOS image sensor 500 makes it possible to prevent the occurrence of color mixing while maintaining the passivation property or interface state, as compared with the case of the CMOS image sensor 100.

6. Sixth Embodiment

Manufacturing

Figure 22:
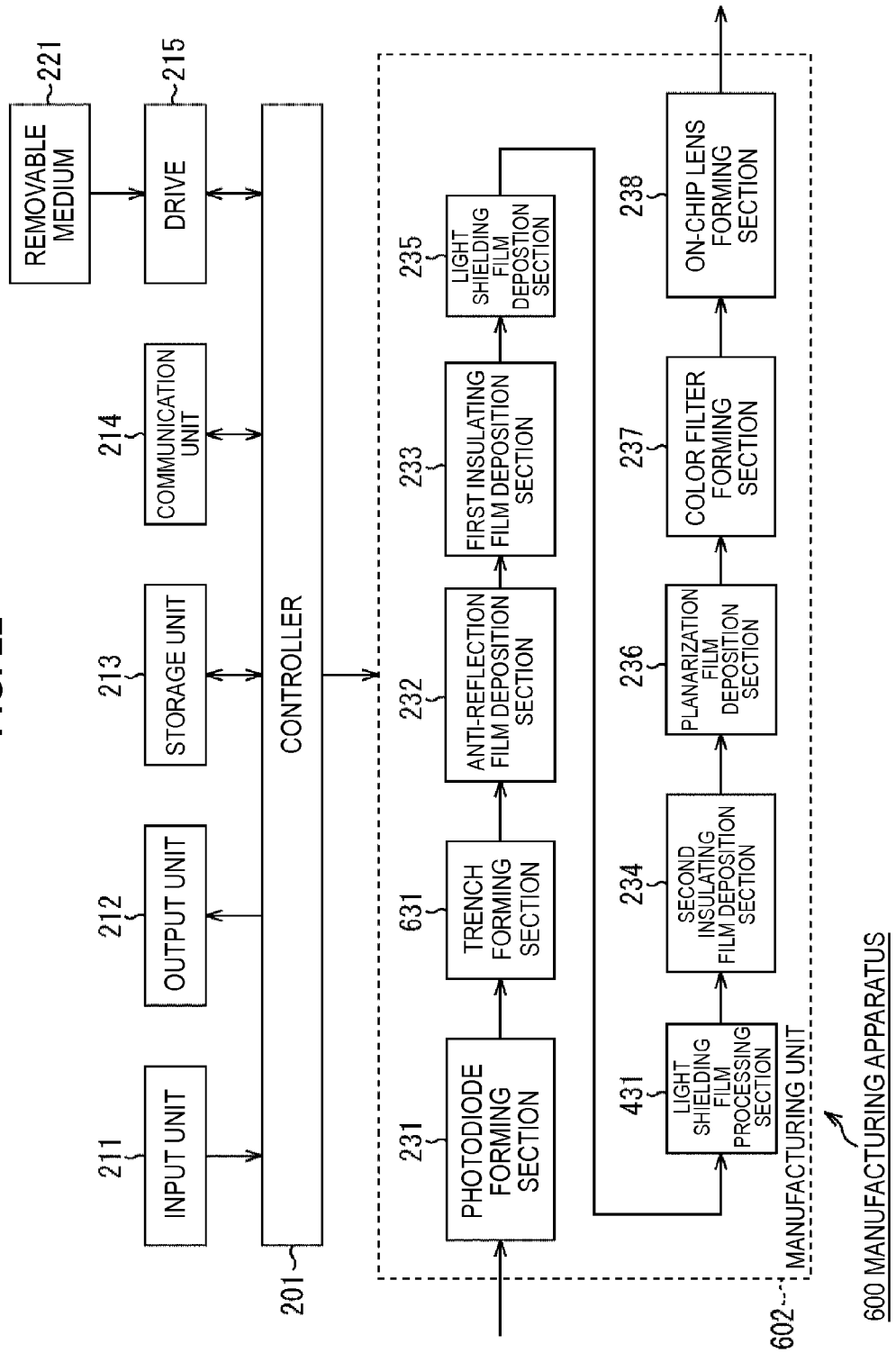
FIG. 22 is a block diagram illustrating still another exemplary configuration of the manufacturing apparatus.

FIG. 22 is a block diagram illustrating an exemplary configuration of a manufacturing apparatus according to an embodiment of the manufacturing apparatus to which the present technology is applied. The manufacturing apparatus 600 illustrated in FIG. 22 is a manufacturing apparatus for manufacturing the CMOS image sensor 500. As illustrated in FIG. 22, the manufacturing apparatus 600 has a similar configuration to the manufacturing apparatus 400 (FIG. 15).

In other words, the manufacturing apparatus 600 includes a controller 201, an input unit 211, an output unit 212, a storage unit 213, a communication unit 214, and a drive 215, as similar to the manufacturing apparatus 400. A removable medium 221 is suitably attached to the drive 215.

However, the manufacturing apparatus 600 includes a manufacturing unit 602 instead of the manufacturing apparatus 402. The manufacturing unit 602 performs a process of manufacturing the CMOS image sensor 500 under the control of the controller 201.

As illustrated in FIG. 22, the manufacturing unit 602 has a similar configuration to the manufacturing unit 402. For example, the manufacturing unit 602 includes a photodiode forming section 231, a anti-reflection film deposition section 232, a first insulating film deposition section 233, a second insulating film deposition section 234, a light shielding film deposition section 235, a planarization film deposition section 236, a color filter forming section 237, an on-chip lens forming section 238, and a light shielding film processing section 431.

However, although it will be described in detail later, the manufacturing unit 602 further includes a trench forming section 631. A device processed by the photodiode forming section 231 is supplied to the trench forming section 631. The device processed by the trench forming section 631 is supplied to the anti-reflection film deposition section 232.

These processing sections (from the photodiode forming section 231 to the on-chip lens forming section 238, the light shielding film processing section 431, and the trench forming section 631) of the manufacturing unit 602 perform the respective processes of manufacturing the image sensor (CMOS image sensor 500) under the control of the controller 201, as described later.

Figure 23:
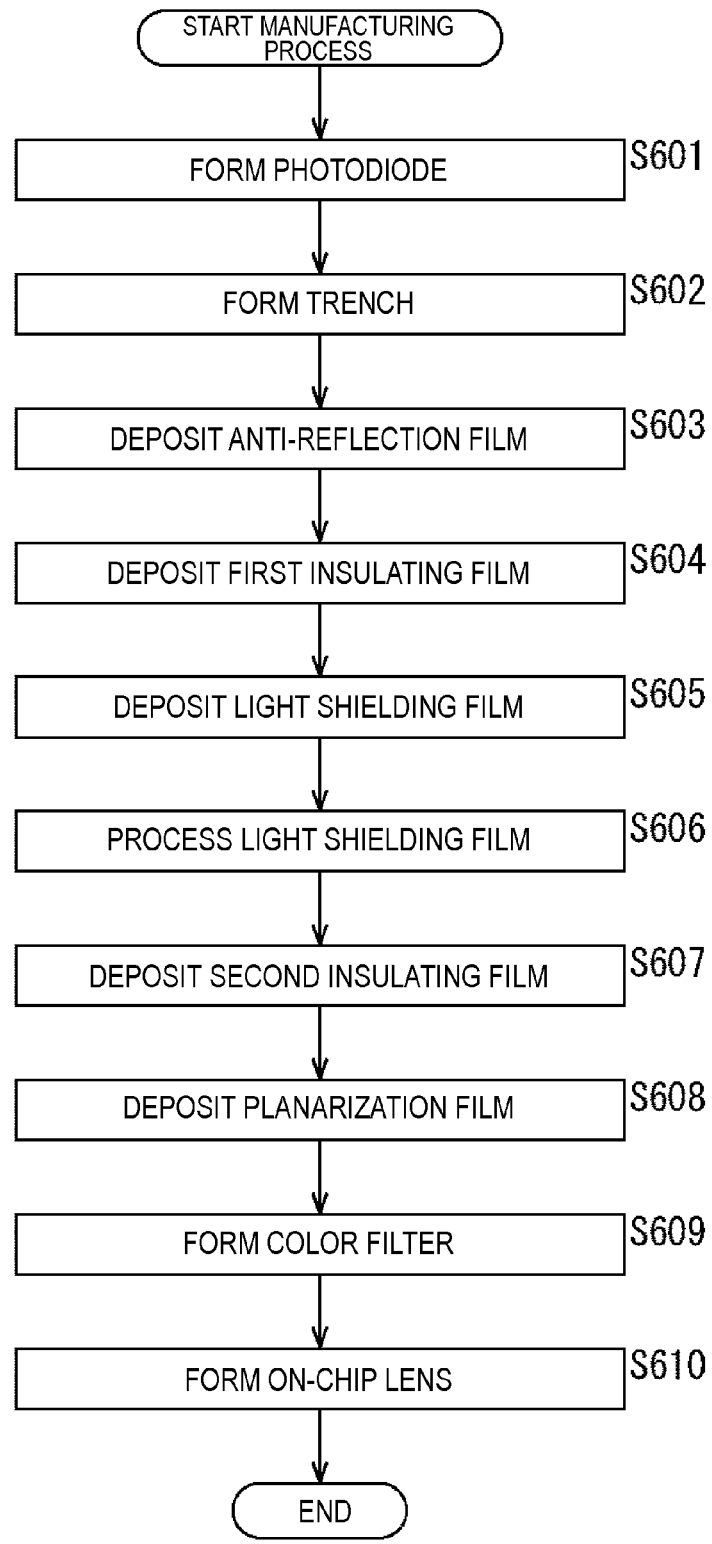
FIG. 23 is a flowchart for explaining still another exemplary procedure of the manufacturing processing.
Figure 24:
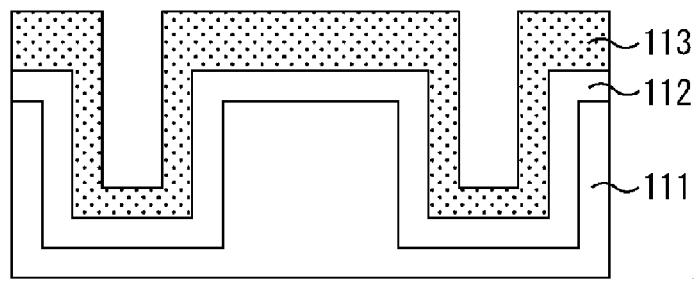
FIG. 24 is a diagram for explaining a step in the manufacturing process.

Referring to the flowchart of FIG. 23, an exemplary flow of a manufacturing process to be performed by the manufacturing apparatus 600 will be described. The description will be given with reference to FIGS. 24 to 27 as appropriate. FIGS. 24 to 27 are diagrams for explaining each step of the manufacturing process.

When the manufacturing process is started, in step S601, the photodiode forming section 231 forms a photodiode or the like (forms the silicon substrate 111 with the photodiode formed therein) on a semiconductor substrate prepared from the external under the control of the controller 201, as similar to the case of step S101 in FIG. 9.

In step S602, the trench forming section 631 forms a trench by the excavation light shielding through a resist mask in the silicon substrate 111 with the photodiode formed therein under the control of the controller 201. After the trench is formed, the trench forming section 631 removes remained photoresist.

In step S603, the anti-reflection film deposition section 232 deposits the anti-reflection film 112 on the silicon substrate 111 in which the photodiode is formed and the trench is formed, under the control of the controller 201, as similar to the case of step S102 in FIG. 9.

In step S604, the first insulating film deposition section 233 deposits the first insulating film 113 on the back-surface side of the anti-reflection film 112 under the control of the controller 201 (FIG. 24), as similar to the case of step S103 in FIG. 9. For example, the first insulating film deposition section 233 deposits a silicon dioxide film ($SiO_2$) as the first insulating film 113 containing no nitrogen.

Figure 16:
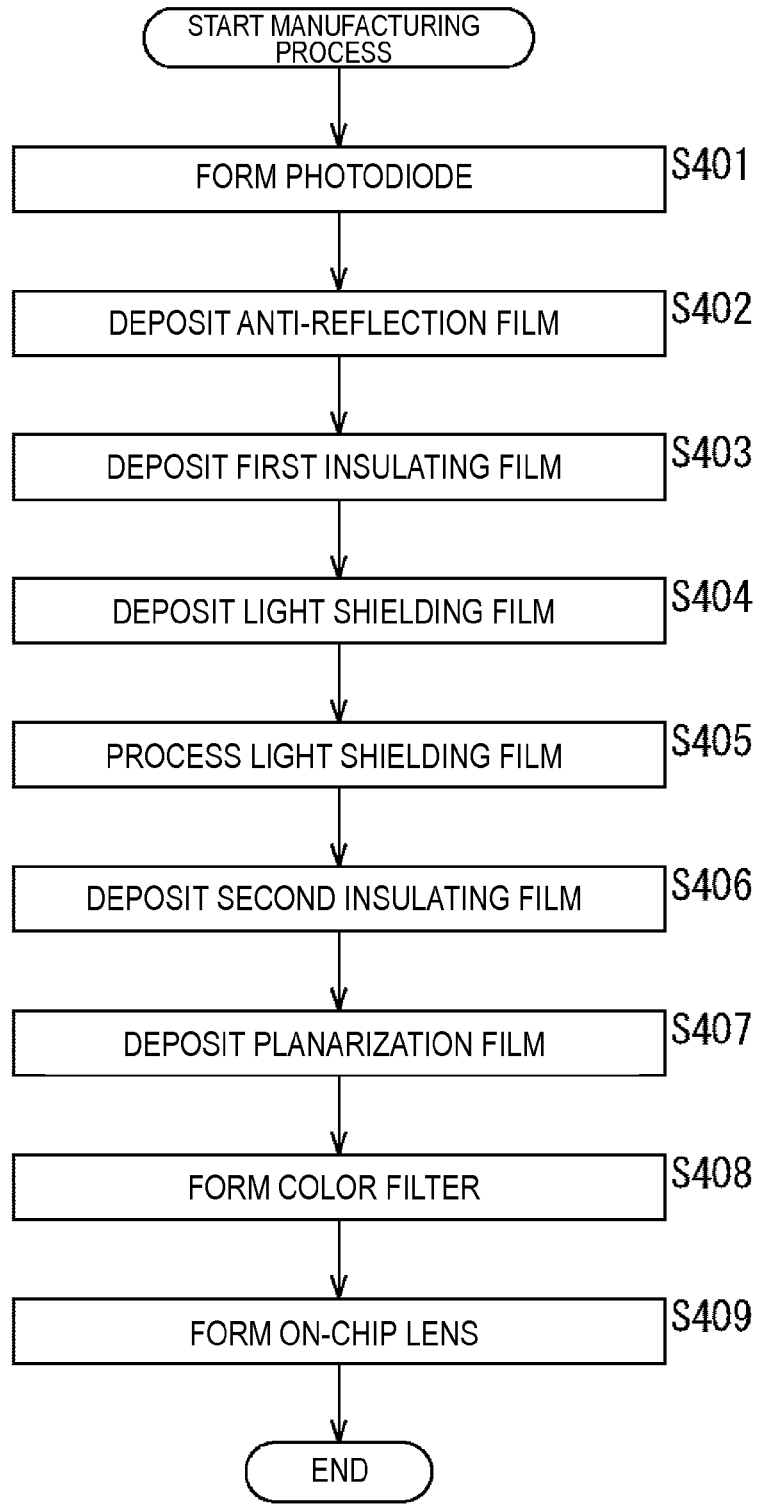
FIG. 16 is a flowchart for explaining another exemplary procedure of the manufacturing processing.

In step S605, the light shielding film deposition section 235 deposits the light shielding film 115 on the back-surface side of the first insulating film 113 under the control of the controller 201 (FIG. 25), as similar to the case of step S404 in FIG. 16. In other words, the light shielding film 115 is made of, for example, a stacked structure of a titanium film (Ti) 441, a titanium nitride film (TiN) 442, and a tungsten film (W) 443, as shown in FIG. 18B. The configuration of the light shielding film 115, or a film thickness or deposition method of each layer constituting the light shielding film 115 are optional, and are not limited to examples described above.

Figure 25:
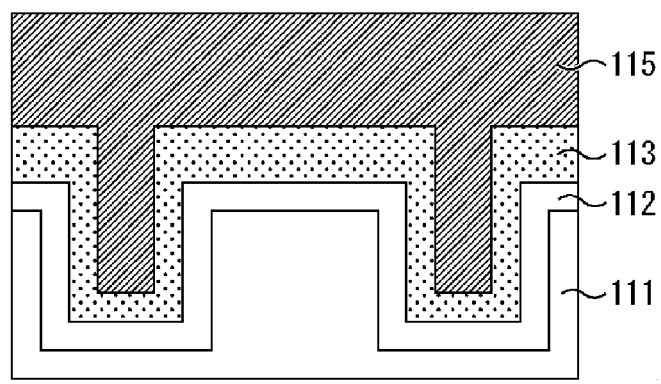
FIG. 25 is a diagram for explaining a step in the manufacturing process.
Figure 26:
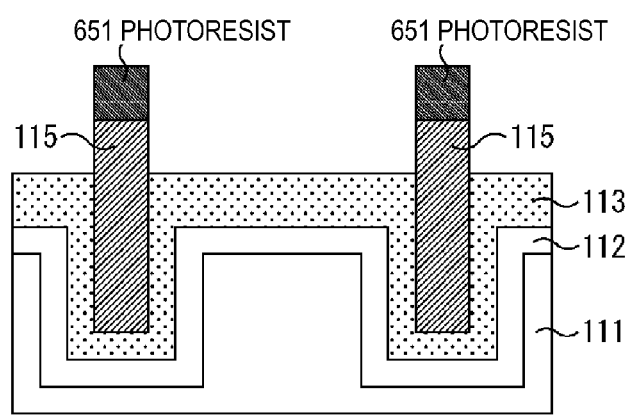
FIG. 26 is a diagram for explaining a step in the manufacturing process.
Figure 27:
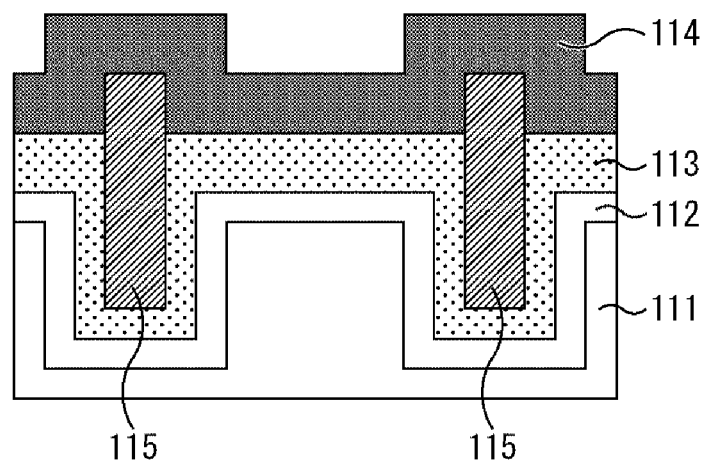
FIG. 27 is a diagram for explaining a step in the manufacturing process.

As illustrated in FIG. 25, in this stage, the light shielding film 115 is deposited on the entire pixel that is not patterned. The light shielding film 115 is also formed on the trench portion of the silicon substrate 111 with the photodiode formed therein.

In step S606, the light shielding film processing section 431 processes the light shielding film 115 through a resist mask under the control of the controller 201, as similar to the case of step S405 in FIG. 16. With this processing of the light shielding film 115 (particularly, the tungsten film (W) 443), a portion near boundary with a neighboring pixel (between pixels) is remained, and the other portions are removed, as the example shown in FIG. 26. In other words, the light shielding film 115 in the trench portion of the silicon substrate 111 with the photodiode formed therein is remained in a mountain shape. After this processing, the light shielding film processing section 431 removes the remained photoresist 651 (the photoresist 651 formed on the back-surface side of the light shielding film 115 remained in a mountain shape).

In step S607, the second insulating film deposition section 234 deposits the second insulating film 114 on the back-surface side of the patterned light shielding film 115 under the control of the controller 201 (FIG. 27), as similar to the case of step S406 in FIG. 16.

Similarly, according to the configuration described above, as illustrated in FIG. 21, the portion through which incident light transmits is a stacked structure similar to the CMOS image sensor 100. This stacked structure includes the first insulating film 113 and the second insulating film 114. Thus, it is possible to increase moisture permeability resistance and suppress deterioration of an interface state, as similar to the case of CMOS image sensor 100. In addition, the second insulating film 114 has a refractive index that is set to be substantially equal to that of the first insulating film 113, or there is a slight difference (for example, the difference in refractive index between them is approximately 0.01 to 0.1) between the two. Accordingly, it is possible to suppress the decrease in transmittance of light.

As similar to the case of the CMOS image sensor 300, it is possible for the interlayer film on the lower side (the side facing the silicon substrate 111 with the photodiode formed therein) of the light shielding film 115 to be thinner than the case of the CMOS image sensor 100 in which the embedded light shielding is performed. Thus, the occurrence of color mixing can be suppressed as compared with the case of the CMOS image sensor 100, thereby preventing the occurrence of color mixing. Further, it is possible for the trench to be smaller in width than the case of the CMOS image sensor 100 in which the embedded light shielding is performed. Accordingly, the size of the portion through which the photodiode receives incident light between the patterned light shielding films 115 can be prevented from being reduced, thereby preventing the decrease in sensitivity.

After the process of step S607 is completed, processes of steps S608 to S610 are performed in a similar manner to the processes of steps S106 to S108, respectively. The planarization film 116, the color filter 117, and the on-chip lens 118 are formed. Then, the CMOS image sensor 500 is manufactured (FIG. 21). If the process of step S610 is completed, the manufacturing process is finished. In practice, thereafter, for example, wiring layer or the like is formed.

As described above, the manufacturing apparatus 600 is capable of manufacturing the CMOS image sensor 500. In other words, the manufacturing apparatus 600 can manufacture the image sensor that can suppress deterioration of an interface state of the silicon substrate interface and suppress the occurrence of color mixing and reduction in sensitivity while suppressing decrease in transmittance of light.

In addition, as described above, the manufacturing apparatus 600 can easily manufacture the CMOS image sensor 500 without using a special or complicated manufacturing method. Thus, on the back-surface side of the anti-reflection film 112, the manufacturing apparatus 600 can easily deposit a silicon oxide film having a refractive index lower than a silicon nitride film and having a higher density in the back-surface side than in the front-surface side. Accordingly, the manufacturing apparatus 600 is able to suppress the reduction in the yield of the CMOS image sensor 500.

Moreover, in the above, as the image sensor to which an embodiment of the present technology is applied, a CMOS image sensor has been described, but an embodiment of the present technology may be applied to image sensors other than the CMOS image sensor, such as an image sensor based on a charge coupled device (CCD).

7. Seventh Embodiment

Imaging Apparatus

Figure 28:
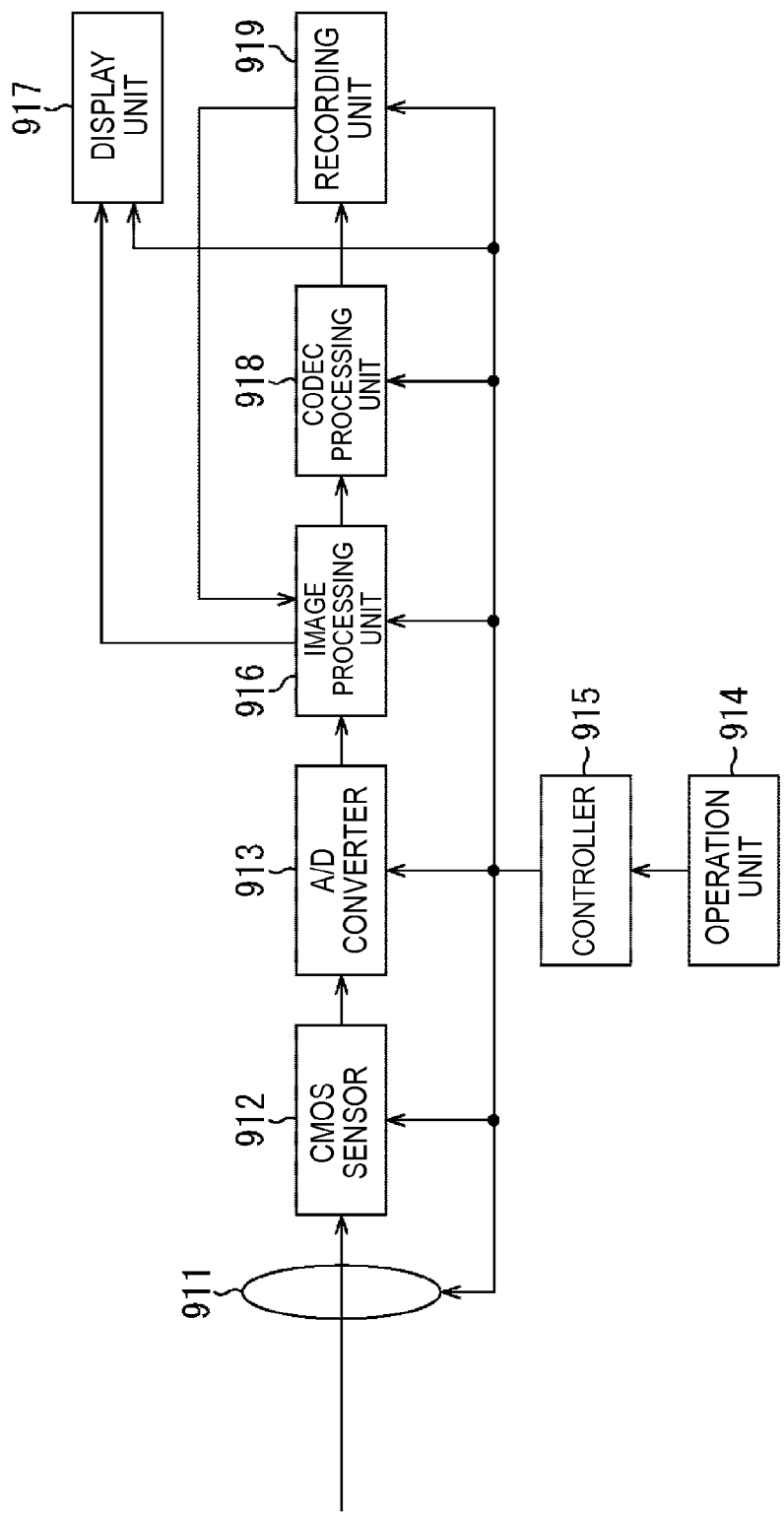
FIG. 28 is a block diagram illustrating an exemplary configuration of an imaging apparatus.

FIG. 28 is a block diagram illustrating an exemplary configuration of an imaging apparatus employing the above-described image sensor. An imaging apparatus 900 illustrated in FIG. 28 is a device which captures a subject and outputs an image of the subject as electrical signals.

As shown in FIG. 28, the imaging apparatus 900 includes an optical unit 911, a CMOS sensor 912, an A/D converter 913, an operation unit 914, a controller 915, an image processing unit 916, a display unit 917, a codec processing unit 918 and a recording unit 919.

The optical unit 911 adjusts focal distance to a subject. The optical unit 911 includes a lens for condensing light from a position in focus, an aperture for adjusting exposure, a shutter for controlling the timing of an image, and so on. The optical unit 911 transmits light (incident light) from a subject and supplies it to the CMOS sensor 912.

The CMOS sensor 912 photoelectrically converts incident light into electric signal and supplies the signal (pixel signal) for each pixel to the A/D converter 913.

The A/D converter 913 converts the pixel signal supplied from CMOS sensor 912 at a predetermined timing into digital data (image data) and supplies it sequentially to the image processing unit 916 at a predetermined timing.

The operation unit 914 may include, for example, Jog Dial (registered trademark), keys, buttons, or a touch panel. The operation unit 914 receives a user's operation input and supplies a signal corresponding to the user's operation input to the controller 915.

The controller 915 controls the optical unit 911, the CMOS sensor 912, the A/D converter 913, the image processing unit 916, the display unit 917, the codec processing unit 918, and the recording unit 919, based on the signal corresponding to the user's operation input inputted to the operation unit 914. The controller 915 causes each component unit to perform a process relevant to imaging.

The image processing unit 916 performs various types of image processing for image data supplied from the A/D converter 913, such as the color mixing correction, black level correction, white balance adjustment, demosaic processing, matrix processing, gamma correction, YC conversion, and so on. The image processing unit 916 supplies image data subjected to image processing to the display unit 917 and codec processing unit 918.

The display unit 917 may include a liquid crystal display, and displays an image of a subject based on image data supplied from the image processing unit 916.

The codec processing unit 918 performs a coding process of a predetermined scheme for image data supplied from the image processing unit 916 and supplies coded data obtained by the coding process to the recording unit 919.

The recording unit 919 stores coded data supplied from the codec processing unit 918. The image processing unit 916 reads out and decodes the coded data stored in the recording unit 919, as necessary. Image data obtained by the decoding process is supplied to the display unit 917 for displaying an image corresponding to image data.

Embodiments of the present technology are applied to the CMOS sensor 912 of the above-described imaging apparatus 900. In other words, as the CMOS sensor 912, as described above, the CMOS image sensor 100, the CMOS image sensor 300, or the CMOS image sensor 500 is employed. Thus, the CMOS sensor 912 makes it possible to suppress deterioration of an interface state of the silicon substrate interface and suppress the decrease in transmittance of light. Accordingly, if the imaging apparatus 900 captures a subject, high quality image can be obtained.

Examples of the image apparatus to which embodiments of the present technology are applicable are not limited to the above-described example, and other configurations may be possible. Examples of the image apparatus may include digital still camera or video camera, or information processing apparatus (electronic device) having an imaging function, such as mobile phones, smart phones, tablet devices, personal computers. In addition, examples of the image apparatus may include a camera module which is used with being attached (or mounted as a built-in device) to another information processing apparatus.

The series of processes described above can be executed in hardware or in software. In the case of executing the series of processes in software as described above, a program constituting software is installed from a network or recording medium.

This recording medium may be configured to include the removable media 221 in which the programs distributed to deliver to a user are stored independently of the apparatus, as shown in FIGS. 8, 15, and 22. Examples of the removable media 221 include a magnetic disk (including a flexible disk) or an optical disk (including a CD-ROM or DVD). Further, examples of the removable media 221 include a magneto-optical disk (including MD (Mini-Disc)) or a semiconductor memory. The recording medium may be configured as the ROM in which programs distributed to a user in a state pre-incorporated in the apparatus as well as the removable media 221 are stored or may be configured as a hard disk included in the storage unit 213.

It should be noted that the program executed by a computer may be a program that is processed in time series according to the sequence described in this specification or a program that is processed in parallel or at necessary timing such as upon calling.

It should be also noted that, in this specification, the steps describing the program stored in the recording medium include not only a process performed in time series according to the sequence shown therein but also a process executed in parallel or individually, not necessarily performed in time series.

Further, in the present disclosure, a system has the meaning of a set of a plurality of configured elements (such as an apparatus or a module (part)), and does not take into account whether or not all the configured elements are in the same casing. Therefore, the system may be either a plurality of apparatuses, stored in separate casings and connected through a network, or a plurality of modules within a single casing.

Further, an element described as a single device (or processing unit) above may be configured as a plurality of devices (or processing units). On the contrary, elements described as a plurality of devices (or processing units) above may be configured collectively as a single device (or processing unit). Further, an element other than those described above may be added to each device (or processing unit). Furthermore, a part of an element of a given device (or processing unit) may be included in an element of another device (or another processing unit) as long as the configuration or operation of the system as a whole is substantially the same.

It should be understood by those skilled in the art that various modifications, combinations, sub-combinations and alterations may occur depending on design requirements and other factors insofar as they are within the scope of the appended claims or the equivalents thereof.

For example, the present disclosure can adopt a configuration of cloud computing which processes by allocating and connecting one function by a plurality of apparatuses through a network.

Further, each step described by the above-mentioned flow charts can be executed by one apparatus or by allocating a plurality of apparatuses.

In addition, in the case where a plurality of processes is included in one step, the plurality of processes included in this one step can be executed by one apparatus or by allocating a plurality of apparatuses.

Additionally, the present technology may also be configured as below.

(1) An image sensor of a back-illuminated type using a complementary metal oxide semiconductor (CMOS), including:

a light receiving unit, formed in a semiconductor substrate, which receives incident light;

an anti-reflection film formed on a back-surface side of the semiconductor substrate in which the light receiving unit is formed; and a silicon oxide film, formed on a back-surface side of the anti-reflection film, which has a refractive index lower than a silicon nitride film and has a higher density in a back-surface side than in a front-surface side thereof.

(2) The image sensor according to (1), wherein the anti-reflection film and the silicon oxide film are formed in a recess at the back-surface side of the semiconductor substrate, the recess being excavated to embed a light shielding film.

(3) The image sensor according to (1) or (2), wherein the silicon oxide film is made of a plurality of layers, and wherein a density of each of the layers is increased toward a back-surface side thereof.

(4) The image sensor according to (3), wherein the silicon oxide film includes a layer of a silicon oxide film containing no nitrogen at the front-surface side and includes a layer of a silicon oxynitride film containing nitrogen at the back-surface side.

(5) The image sensor according to (4), further including:

a light shielding film formed near a boundary with a neighboring pixel between the layer of the silicon oxide film containing no nitrogen and the layer of the silicon oxynitride film containing nitrogen.

(6) The image sensor according to (5), wherein the anti-reflection film and the layer of the silicon oxide film containing no nitrogen are formed in a recess at the back-surface side of the semiconductor substrate, the recess being excavated to embed a light shielding film.

(7) The image sensor according to (3) or (4), wherein a refractive index of each layer of the silicon oxide film is increased toward the back-surface side.

(8) The image sensor according to any one of (1) to (5), wherein the silicon oxide film is formed to have a density that is continuously increased toward the back-surface side from the front-surface side.

(9) The image sensor according to (8), wherein the silicon oxide film does not contain nitrogen at a surface and is formed to have a content of nitrogen that is continuously increased toward the back-surface side from the front-surface side.

(10) The image sensor according to (8), wherein the silicon oxide film is formed to have a refractive index that is continuously increased toward the back-surface side from the front-surface side.

(11) The image sensor according to (1), wherein the light receiving unit, the anti-reflection film, and the silicon oxide film are formed in an OPB pixel.

(12) An imaging apparatus including:
an image sensor of a back-illuminated type using a complementary metal oxide semiconductor (CMOS), the image sensor including
a light receiving unit, formed in a semiconductor substrate, which receives incident light,
an anti-reflection film formed on a back-surface side of the semiconductor substrate in which the light receiving unit is formed, and
a silicon oxide film, formed on a back-surface side of the anti-reflection film, which has a refractive index lower than a silicon nitride film and has a higher density in a back-surface side than in a front-surface side thereof; and
an image processing unit for performing an image processing on image data obtained from the image sensor.

(13) An apparatus for manufacturing a back-illuminated image sensor using a complementary metal oxide semiconductor (CMOS), including:
an anti-reflection film deposition section for depositing an anti-reflection film on a back-surface side of a semiconductor substrate in which a light receiving unit for receiving incident light is formed; and
a silicon oxide film deposition section for depositing a silicon oxide film on the back-surface side of the semiconductor substrate on which the anti-reflection film is deposited by the anti-reflection film deposition section,
wherein the silicon oxide film has a refractive index lower than a silicon nitride film and has a higher density in a back-surface side than in a front-surface side thereof.

(14) The apparatus according to (13), wherein the anti-reflection film deposition section and the silicon oxide film deposition section deposit the anti-reflection film and the silicon oxide film, respectively, in a recess at the back-surface side of the semiconductor substrate, the recess being excavated to embed a light shielding film.

(15) The apparatus according to (13), wherein the silicon oxide film deposition section deposits a plurality of layers of the silicon oxide film so that a density of each of the layers is increased toward a back-surface side.

(16) The apparatus according to (15),
wherein the silicon oxide film deposition section includes
a first silicon oxide film deposition section for depositing a layer of a silicon oxide film containing no nitrogen on a front-surface side thereof as the silicon oxide film, and
a second silicon oxide film deposition section for depositing a layer of a silicon oxynitride film containing nitrogen on a back-surface side thereof as the silicon oxide film.

(17) The apparatus according to (16), further including:
a light shielding film deposition section for depositing a light shielding film; and
a light shielding film processing section for processing the light shielding film deposited by the light shielding film deposition section in a manner that a portion of the light shielding film near a boundary with a neighboring pixel is remained,
wherein the light shielding film deposition section deposits the light shielding film on a back-surface side of the layer of the silicon oxide film containing no nitrogen which is deposited by the first silicon oxide film deposition section, and
wherein the second silicon oxide film deposition section deposits the layer of the silicon oxynitride film containing nitrogen on a back-surface side of the light shielding film which is processed by the light shielding film processing section.

(18) The apparatus according to (16), further including:
a recess forming portion for excavating a recess to embed the light shielding film into the back-surface side of the semiconductor substrate,
wherein the anti-reflection film deposition section and the first silicon oxide film deposition section deposit the anti-reflection film and the layer of the silicon oxide film containing no nitrogen, respectively, on the recess formed by the recess forming portion at the back-surface side of the semiconductor substrate.

(19) The apparatus according to (1), wherein the silicon oxide film deposition section deposits the silicon oxide film in a manner that the silicon oxide film appropriately contains nitrogen to allow a density of the silicon oxide film to be controlled depending on a content of nitrogen.

(20) A method for manufacturing an image sensor of a back-illuminated type using a complementary metal oxide semiconductor (CMOS) in a manufacturing apparatus, the method includes depositing an anti-reflection film on a back-surface side of a semiconductor substrate in which a light receiving unit for receiving incident light is formed; and depositing a silicon oxide film having a refractive index lower than a silicon nitride film and having a higher density in a back-surface side than in a front-surface side thereof on a back-surface side of the anti-reflection film deposited on the back-surface side of the semiconductor substrate.

The present disclosure contains subject matter related to that disclosed in Japanese Priority Patent Application JP 2012-175540 filed in the Japan Patent Office on Aug. 8, 2012, and Japanese Priority Patent Application JP 2013-109611 filed in the Japan Patent Office on May 24, 2013, the entire contents of which are hereby incorporated by reference.

What is claimed is:

1. An image sensor of a back-illuminated type using a complementary metal oxide semiconductor (CMOS), comprising:
a light receiving unit in a semiconductor substrate;
an anti-reflection film on a back-surface side of the semiconductor substrate; and
an insulating film comprising silicon and oxygen throughout from a back-surface side of the insulating film to a front-surface side of the insulating film, the insulating film being on a back-surface side of the anti-reflection film, the insulating film having (a) a refractive index that is lower than that of a silicon nitride film and (b) a density that is higher at the back-surface side than that at the front-surface side of the insulating film,
wherein the insulating film includes a layer of a silicon oxide film containing no nitrogen at the front-surface side of the insulating film and includes a layer of a silicon oxynitride film containing nitrogen at the back-surface side of the insulating film; and
a light shielding film,
wherein the light shielding film is near a boundary with a neighboring pixel between the layer of the silicon oxide film containing no nitrogen and the layer of the silicon oxynitride film containing nitrogen.

2. The image sensor according to claim 1, wherein
the anti-reflection film and the insulating film are in a recess at the back-surface side of the semiconductor substrate, and
the light shielding film is embedded in the recess.

3. The image sensor according to claim 1, wherein:
the insulating film comprises a plurality of layers, and a density of each of the plurality of layers is increased toward the back-surface side of the insulating film.

4. The image sensor according to claim 3, wherein a refractive index of each of the plurality of layers of the insulating film is increased toward the back-surface side of the insulating film.

5. The image sensor according to claim 1, wherein the density of the insulating film is gradually increased toward the back-surface side of the insulating film from the front-surface side of the insulating film.

6. The image sensor according to claim 5, wherein the insulating film does not contain nitrogen at the front-surface side and has a content of nitrogen that is gradually increased toward the back-surface side of the insulating film from the front-surface side of the insulating film.

7. The image sensor according to claim 5, wherein the refractive index of the insulating film is gradually increased toward the back-surface side of the insulating film from the front-surface side of the insulating film.

8. The image sensor according to claim 1, wherein the light receiving unit, the anti-reflection film, and the insulating film are in an optical black (OPB) pixel.

9. An image sensor of a back-illuminated type using a complementary metal oxide semiconductor (CMOS), comprising:
   a light receiving unit in a semiconductor substrate, the light receiving unit to receive incident light;
   an anti-reflection film on a back-surface side of the semiconductor substrate;
   an insulating film comprising silicon and oxygen, the insulating film being on a back-surface side of the anti-reflection film, the insulating film having (a) a refractive index that is lower than that of a silicon nitride film and (b) a density that is higher at a back-surface side of the insulating film than that at a front-surface side of the insulating film; and
   a light shielding film, wherein,
   the insulating film comprises a plurality of layers including a layer of a silicon oxide film containing no nitrogen at a front-surface side and a layer of a silicon oxynitride film containing nitrogen at the back-surface side,
   a density of each of the plurality of layers is increased toward the back-surface side of the insulating film, and
   the light shielding film is near a boundary with a neighboring pixel between the layer of the silicon oxide film containing no nitrogen and the layer of the silicon oxynitride film containing nitrogen.

10. The image sensor according to claim 9, wherein:
   the anti-reflection film and the layer of the silicon oxide film containing no nitrogen are in a recess at the back-surface side of the semiconductor substrate,
   the light shielding film is embedded in the recess.

11. An imaging apparatus comprising:
   an image sensor of a back-illuminated type using a complementary metal oxide semiconductor (CMOS), the image sensor including (i) a light receiving unit in a semiconductor substrate, (ii) an anti-reflection film on a back-surface side of the semiconductor substrate, and (iii) an insulating film comprising silicon and oxygen throughout from a back-surface side of the insulating film to a front-surface side of the insulating film, the insulating film being on a back-surface side of the anti-reflection film, the insulating film having (a) a refractive index lower that is than that of a silicon nitride film and (b) a density that is higher at the back-surface side of the insulating film than that at the front-surface side of the insulating film;
   an image processing unit to perform image processing on image data obtained from the image sensor,
      wherein the insulating film includes a layer of a silicon oxide film containing no nitrogen at the front-surface side of the insulating film and includes a layer of a silicon oxynitride film containing nitrogen at the back-surface side of the insulating film; and
   a light shielding film,
   wherein the light shielding film is near a boundary with a neighboring pixel between the layer of the silicon oxide film containing no nitrogen and the layer of the silicon oxynitride film containing nitrogen.

12. The imaging apparatus of claim 11, wherein the anti-reflection film has a refractive index that is higher than that of the insulating film.

13. The image apparatus of claim 11, wherein,
   the anti-reflection film and the insulating film are in a recess at the back-surface side of the semiconductor substrate, and
   the light shielding film is embedded in the recess.

* * * * *